(12) United States Patent
Kim et al.

(10) Patent No.: US 12,432,916 B2
(45) Date of Patent: Sep. 30, 2025

(54) STORAGE DEVICE, STORAGE SYSTEM, AND OPERATION METHOD OF STORAGE DEVICE

(71) Applicant: SAMSUNG ELECTRONICS CO., LTD., Suwon-si (KR)

(72) Inventors: Minho Kim, Seongnam-si (KR); Kyungsoo Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 538 days.

(21) Appl. No.: 17/898,816

(22) Filed: Aug. 30, 2022

(65) Prior Publication Data

US 2023/0189519 A1 Jun. 15, 2023

(30) Foreign Application Priority Data

Dec. 14, 2021 (KR) .................. 10-2021-0178425

(51) Int. Cl.
*H10B 41/41* (2023.01)
*H01L 25/18* (2023.01)
(Continued)

(52) U.S. Cl.
CPC ............. *H10B 41/41* (2023.02); *H01L 25/18* (2013.01); *H10B 10/18* (2023.02); *H10B 12/50* (2023.02);
(Continued)

(58) Field of Classification Search
CPC ........ H10B 41/41; H10B 41/35; H10B 43/35; H10B 43/40; H10B 10/18; H10B 12/50;
(Continued)

(56) References Cited

U.S. PATENT DOCUMENTS 8,476,708 B2 * 7/2013 Fukuzumi .............. H10D 87/00
257/326
9,111,941 B2 * 8/2015 Gong ................ H01L 23/49827
(Continued)

FOREIGN PATENT DOCUMENTS

CN 113224070 A 8/2021
CN 113257796 A 8/2021
(Continued)

OTHER PUBLICATIONS

Extended European Search Report in European Appln. No. 22208495.6, mailed on Aug. 1, 2023, 9 pages.

*Primary Examiner* — Joseph C. Nicely
(74) *Attorney, Agent, or Firm* — Fish & Richardson P.C.

(57) ABSTRACT

A storage device includes a first semiconductor structure having a first cell area, with memory cells disposed on a first semiconductor substrate, and a first metal pad disposed above the first cell area. A second semiconductor structure has a peripheral circuit area on a second semiconductor substrate and on which peripheral circuits are disposed, a second cell area including a plurality of second memory cells, and a second metal pad bonded to the first metal pad. A third semiconductor structure includes a memory controller disposed on a third semiconductor substrate and connected to a third metal pad through a connection via penetrating through the third semiconductor substrate. A connection structure penetrates through the second semiconductor substrate and connects the memory controller to the second semiconductor structure. The memory controller controls the first and second cell areas based on a signal applied from a host through the third metal pad.

20 Claims, 20 Drawing Sheets

(51) Int. Cl.
*H10B 10/00* (2023.01)
*H10B 12/00* (2023.01)
*H10B 41/35* (2023.01)
*H10B 43/35* (2023.01)
*H10B 43/40* (2023.01)
*H10D 88/00* (2025.01)
*H01L 25/065* (2023.01)
*H01L 25/10* (2006.01)

(52) U.S. Cl.
CPC ............ *H10B 41/35* (2023.02); *H10B 43/35* (2023.02); *H10B 43/40* (2023.02); *H10D 88/00* (2025.01); *H01L 25/0657* (2013.01); *H01L 25/105* (2013.01); *H01L 2224/08145* (2013.01); *H01L 2224/09181* (2013.01)

(58) Field of Classification Search
CPC ... H01L 25/18; H01L 25/0657; H01L 25/105; H01L 2224/08145; H01L 2224/09181; H10D 88/00
See application file for complete search history.

(56) References Cited

U.S. PATENT DOCUMENTS

| | | | |
|---|---|---|---|
| 10,937,766 | B2 | 3/2021 | Liu |
| 11,056,454 | B2 | 7/2021 | Liu |
| 2018/0277497 | A1* | 9/2018 | Matsuo ................. H10D 88/00 |
| 2020/0203328 | A1* | 6/2020 | Park ...................... H10B 43/27 |
| 2020/0312817 | A1 | 10/2020 | Wu et al. |
| 2020/0328176 | A1* | 10/2020 | Liu ........................ H10B 12/50 |
| 2020/0328186 | A1* | 10/2020 | Liu ........................ H01L 25/50 |
| 2020/0350286 | A1 | 11/2020 | Cheng et al. |
| 2020/0402562 | A1* | 12/2020 | Li ........................... H01L 25/50 |
| 2021/0111150 | A1 | 4/2021 | Liu |
| 2021/0151413 | A1* | 5/2021 | Liu ........................ G11C 11/005 |
| 2021/0210460 | A1 | 7/2021 | He |
| 2021/0391302 | A1 | 12/2021 | Kao et al. |
| 2022/0068905 | A1* | 3/2022 | Huang ................. H01L 23/481 |

FOREIGN PATENT DOCUMENTS

| | | |
|---|---|---|
| KR | 10-2021-0113644 | 9/2021 |
| WO | WO 2020/220484 | 11/2020 |
| WO | WO 2020/220555 | 11/2020 |

* cited by examiner

STORAGE DEVICE, STORAGE SYSTEM, AND OPERATION METHOD OF STORAGE DEVICE

CROSS-REFERENCE TO RELATED APPLICATION(S)

This application claims the benefit under 35 USC 119(a) of Korean Patent Application No. 10-2021-0178425 filed on Dec. 14, 2021, in the Korean Intellectual Property Office, the entire disclosure of which is incorporated herein by reference for all purposes.

BACKGROUND

The present disclosure relates to a storage device, a storage system, and a method of operating a storage device.

A storage device, particularly a storage device including a flash memory device, a non-volatile memory, includes a buffer memory and a memory controller to store or read data from or to a memory cell through a write operation and a read operation. The memory controller receives data and/or control commands from a host and applies commands for implementing the write operation and/or the read operation of the flash memory device to the flash memory device implemented as a separate chip. As an integration of memory cells approaches the limit, the storage device may have a three-dimensional structure in which components thereof are stacked.

SUMMARY

The present disclosure provides a storage device with a reduced size and improved operating speed by forming a non-volatile memory, a buffer memory, and a memory controller included in a storage device in the form of a single stacked chip.

According to an aspect of the present disclosure, a storage device may include a first semiconductor structure including a first cell area, including a plurality of memory cells disposed on a first semiconductor substrate, and a first metal pad disposed above the first cell area. The first cell area includes gate electrodes stacked on the first semiconductor substrate, spaced apart from each other, and channel structures penetrating through the gate electrodes and connected to the first semiconductor substrate. A second semiconductor structure includes a peripheral circuit area, disposed on a second semiconductor substrate and in which peripheral circuits for controlling the plurality of first memory cells are disposed, a second cell area including a plurality of second memory cells disposed adjacently to the peripheral circuit area, and a second metal pad bonded to the first metal pad. A third semiconductor structure includes a memory controller, disposed on a third semiconductor substrate and connected to a third metal pad through a connection via penetrating through the third semiconductor substrate, and a connection structure penetrating through the second semiconductor substrate and connecting the memory controller to the second semiconductor structure. The memory controller controls the first cell area and the second cell area based on a signal applied from a host through the third metal pad.

According to another aspect of the present disclosure, a storage device may include a non-volatile memory including a first cell area, including a plurality of first memory cells disposed on a first semiconductor substrate, and a peripheral circuit area disposed on a second semiconductor substrate and including a peripheral circuit for controlling the plurality of first memory cells. A buffer memory includes a second cell area disposed on the second semiconductor substrate, the second cell area including a plurality of second memory cells temporarily storing data to be stored in the plurality of first memory cells and data stored in the plurality of first memory cells. A memory controller is disposed on a third semiconductor substrate and controls an operation on the plurality of second memory cells using a selection circuit disposed on the second semiconductor substrate, in which a first metal pad disposed above the first cell area and a second metal pad disposed above the peripheral circuit are bonded to each other in a direction perpendicular to an upper surface of the first semiconductor substrate. A connection structure penetrates through the second semiconductor substrate and is electrically connected to the third semiconductor substrate.

According to still another aspect of the present disclosure, a storage system may include a plurality of storage devices each configured in a single chip including a first semiconductor structure including a first cell area, a second semiconductor structure bonded to the first semiconductor structure by a wafer bonding method and including a peripheral circuit area and a second cell area, and a third semiconductor structure on which a memory controller is disposed. The memory controller is connected to the second semiconductor structure through a connection structure penetrating through the semiconductor substrate included in the second semiconductor structure. A network switch is configured to distribute data to the plurality of storage devices. A connector is configured to receive the data from a host and transmits the data to the network switch.

According to yet another aspect of the present disclosure, a method of operating a storage device may include: (1) receiving, by a memory controller, data and a write command from a host, (2) converting, by the memory controller, the write command into a control signal, (3) determining, by the memory controller, a characteristic of the data and whether to store the data in a second cell area, and (4) applying, by the memory controller, the control signal to a non-volatile memory and inputting the data to the non-volatile memory using the control signal. A first semiconductor substrate on which a first cell area included in the non-volatile memory is disposed and a second semiconductor substrate on which a peripheral circuit area and the second cell area are disposed are electrically bonded by a wafer bonding method. The second semiconductor substrate and a third semiconductor substrate on which the memory controller is disposed are bonded through a connection structure penetrating through the second semiconductor substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments in the present disclosure will be described with reference to the accompanying drawings.

Figure 1:
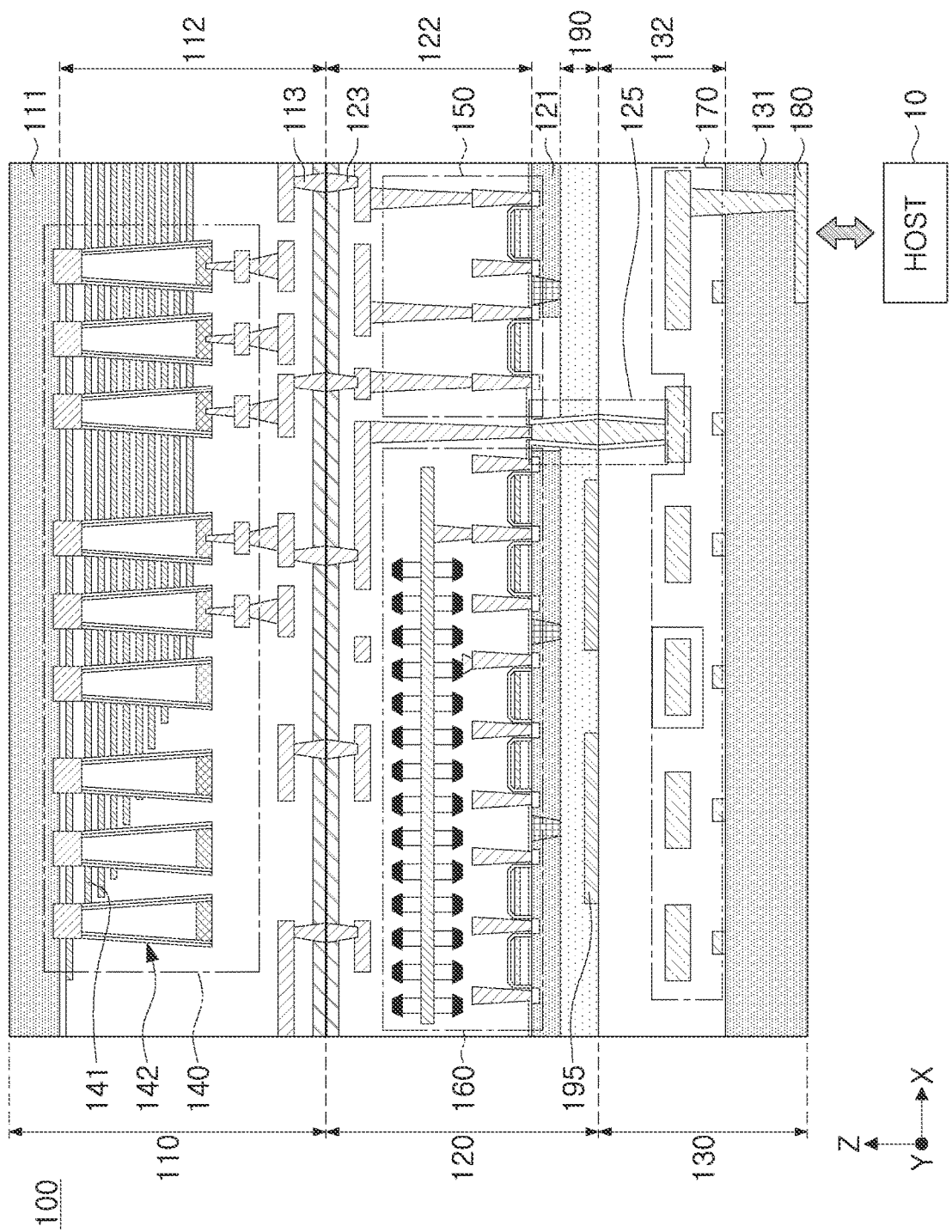
FIG. 1 is a cross-sectional view schematically illustrating a storage device according to an exemplary embodiment in the present disclosure.

FIG. 1 is a cross-sectional view schematically illustrating a storage device according to an exemplary embodiment in the present disclosure.

The storage device may include storage media for storing data according to a request from a host, such as a mobile phone, a smart phone, an MP3 player, a laptop computer, a desktop computer, a game machine, a TV, and a tablet PC. As an example, the storage device may include at least one of a solid state drive (SSD), an embedded memory, and a removable external memory. Hereinafter, the storage device according to the exemplary embodiment in the present disclosure described in the present specification may be an SSD. Accordingly, the storage device may be a device conforming to the non-volatile memory express (NVMe) standard.

In the conventional storage device, when a non-volatile memory, a buffer memory, and a memory controller are disposed on the same plane of a printed circuit board, the non-volatile memory, the buffer memory, and the memory controller may occupy a relatively large area on the printed circuit board, so the integration efficiency may be reduced, and the size of the storage device may be increased and the production cost may be increased. In addition, even when a structure in which only a portion of the configuration of the storage device is stacked is used, a step of interpreting a command signal applied to the non-volatile memory during a write and/or read operation is essentially required, thereby reducing the operating speed.

The size of the storage device 100 according to the exemplary embodiment in the present disclosure may be reduced by forming the non-volatile memory, the buffer memory, and the memory controller as a single chip having a stacked structure. In addition, the storage device according to the exemplary embodiment in the present disclosure may minimize a connection length between the non-volatile memory and the memory controller and may omit a step of interpreting a command signal by directly applying the control signal to the non-volatile memory, thereby improving the operating speed of the storage device.

Referring to FIG. 1, the storage device 100 according to the exemplary embodiment in the present disclosure may include a first semiconductor structure 110, a second semiconductor structure 120, and a third semiconductor structure 130 that have a structure stacked in a first direction (e.g., a Z direction).

The first semiconductor structure 110 may include a first semiconductor substrate 111 and an upper area 112 of the first semiconductor substrate (the first semiconductor structure 110 is illustrated in an inverted aspect). The upper area 112 of the first semiconductor substrate may include a first cell area 140 and a first metal pad 113 disposed above the first cell area 140.

The first semiconductor substrate 111 may include silicon (Si), silicon germanium (SiGe), gallium arsenide (GaAs), germanium (Ge), silicon on insulator (SOI), or other suitable materials. The semiconductor substrates 111, 121, and 131 that are included in the semiconductor structures 110, 120, and 130 included in the storage device 100 may include the same material. However, this is only an example and may not be limited.

The first cell area 140 may include a plurality of first memory cells for storing data. For example, the plurality of first memory cells may include gate electrodes 141 stacked on a first semiconductor substrate 111 spaced apart from each other and channel structures 142 penetrating through the gate electrodes 141 and connected to the first semiconductor substrate 111. That is, the plurality of first memory cells may be memory cells constituting a vertical NAND flash memory (VNAND).

Meanwhile, the storage device 100 according to the exemplary embodiment in the present disclosure may be applied to a charge trap flash (CFT) in which a charge storage layer is formed of an insulating layer as well as a flash memory device in which the charge storage layer is formed of a conductive floating gate.

The second semiconductor structure 120 may include a second semiconductor substrate 121 and an upper area 122 of the second semiconductor substrate. The upper area 122 of the second semiconductor substrate may include a peripheral circuit area 150 including peripheral circuits of the non-volatile memory, a second cell area 160, and a second metal pad 123 disposed above the peripheral circuit area 150 and/or the second cell area 160.

The peripheral circuit area 150 may include peripheral circuits for controlling the first cell area 140, in particular, the plurality of first memory cells. For example, the peripheral circuits may include a page buffer, a decoder, a sense amplifier, a write driver, a charge pump, and the like and the peripheral circuits may include arbitrary devices (e.g., diode, resistor, or capacitor), including a plurality of transistors disposed on the second semiconductor substrate 121, and wirings.

The second cell area 160 may include a plurality of second memory cells disposed adjacently to the peripheral circuit area 150. Referring to FIG. 1, the second cell area 160 according to the exemplary embodiment in the present disclosure may include a dynamic random access memory (DRAM). The second cell area 160 may be a buffer memory that adjusts a data transfer rate between the non-volatile memory and a host 10 by temporarily storing data stored in or read from the non-volatile memory.

For example, the plurality of second memory cells included in the second cell area 160 including the DRAM may be DRAM cells and each of the DRAM cells may be implemented by a select transistor and a capacitor. However, this is only an exemplary embodiment and is not limited thereto and the second cell area 160 may include, in addition to the DRAM, a buffer memory operating on a different principle, such as a static random access memory (SRAM), a magnetoresistive random access memory (MRAM), and a phase-change random access memory (PRAM).

Accordingly, elements included in the second cell area 160 and structures thereof may vary. For example, at least some of the peripheral circuits included in the peripheral circuit area 150 may be disposed above or below the second cell area 160.

The second metal pad 123 disposed above the peripheral circuit area 150 and/or the second cell area 160 may be bonded to the first metal pad 113 in a first direction. The first metal pad 113 and the second metal pad 123 may connect the first semiconductor structure 110 and the second semiconductor structure 120 by a wafer bonding method.

The wafer bonding method may form a direct connection path having a short connection length between the first semiconductor structure 110 and the second semiconductor structure 120. Accordingly, the wafer bonding method may improve an input/output speed of data and control signals while eliminating delay due to a chip interface and reducing power consumption.

Meanwhile, the first metal pad 113 and the second metal pad 123 may include tungsten (W), cobalt (Co), copper (Cu), aluminum (Al), silicide, or the like. Each of the first metal pad 113 and the second metal pad 123 may be electrically separated by adjacent layers in the second direction (e.g., X direction) and/or third direction (e.g., Y direction). As one example, the layer may include silicon oxide, silicon nitride, a low-k dielectric, or the like.

Referring to FIG. 1, the storage device 100 according to the exemplary embodiment in the present disclosure may further include a pad-out layer 190 disposed on a lower surface of the second semiconductor substrate 121. As an example, the pad-out layer 190 may include a dielectric material such as silicon oxide, silicon nitride, and a low-k dielectric.

The pad-out layer 190 may include one or more contact pads 195 for electrically connecting peripheral circuits included in the peripheral circuit area 150 and the second cell area 160 to an external circuit. Since the first semiconductor structure 110 and the second semiconductor structure 120 are electrically connected to each other by the wafer bonding method, an electrical signal of an external circuit applied to the contact pad 195 may be transmitted to the first cell area 140 included in the first semiconductor structure 110. That is, the contact pad 195 may transmit an electrical signal between the non-volatile memory and the external circuit for pad-out.

The third semiconductor structure 130 may include a third semiconductor substrate 131 and an upper area 132 of the third semiconductor substrate. The upper area 132 of the third semiconductor substrate may include a memory controller 170 and a connection structure 125.

The connection structure 125 may electrically connect the second semiconductor structure 120 and the third semiconductor structure 130 by penetrating through the second semiconductor substrate 121. FIG. 1 illustrates that the connection structure 125 completely penetrates through the second semiconductor substrate 121 and the pad-out layer 190 and is directly connected between a contact extending from an upper interconnection layer of the second semiconductor structure 120 and an upper interconnection layer of the third semiconductor structure 130. However, this is only an exemplary embodiment and may not be limited. For example, the connection structure 125 may be formed in various structures according to process methods and exemplary embodiments.

The memory controller 170 may transmit and receive signals to and from the non-volatile memory electrically connected through the connection structure 125. The memory controller 170 may control the overall operation of the non-volatile memory based on signals transmitted and received to and from the non-volatile memory.

In the storage device 100 according to the exemplary embodiment in the present disclosure, a third metal pad 180 may be disposed on a lower surface of the third semiconductor substrate 131. The third metal pad 180 may be electrically connected to the memory controller 170 through a connection via penetrating through the third semiconductor substrate 131.

The memory controller 170 may receive a control command from the host 10 through the third metal pad 180 and transmit and receive data. The memory controller 170 may generate control signals for the first cell area 140 and the second cell area 160 based on the control command applied from the host 10 and may control the operation of the non-volatile memory based on the control signals.

Similar to the wafer bonding method, the connection structure 125 may form a direct connection path having a short connection length between the second semiconductor structure 120 and the third semiconductor structure 130. Accordingly, the connection structure 125 may improve an input/output speed of data and control signals while eliminating delay due to a chip interface and reducing power consumption.

The storage device 100 according to the exemplary embodiment in the present disclosure may reduce the chip size by vertically stacking the non-volatile memory including the first cell area 140 and the peripheral circuit area 150, the second cell area 160, and the memory controller 170 and may directly connect each component.

Figure 2:
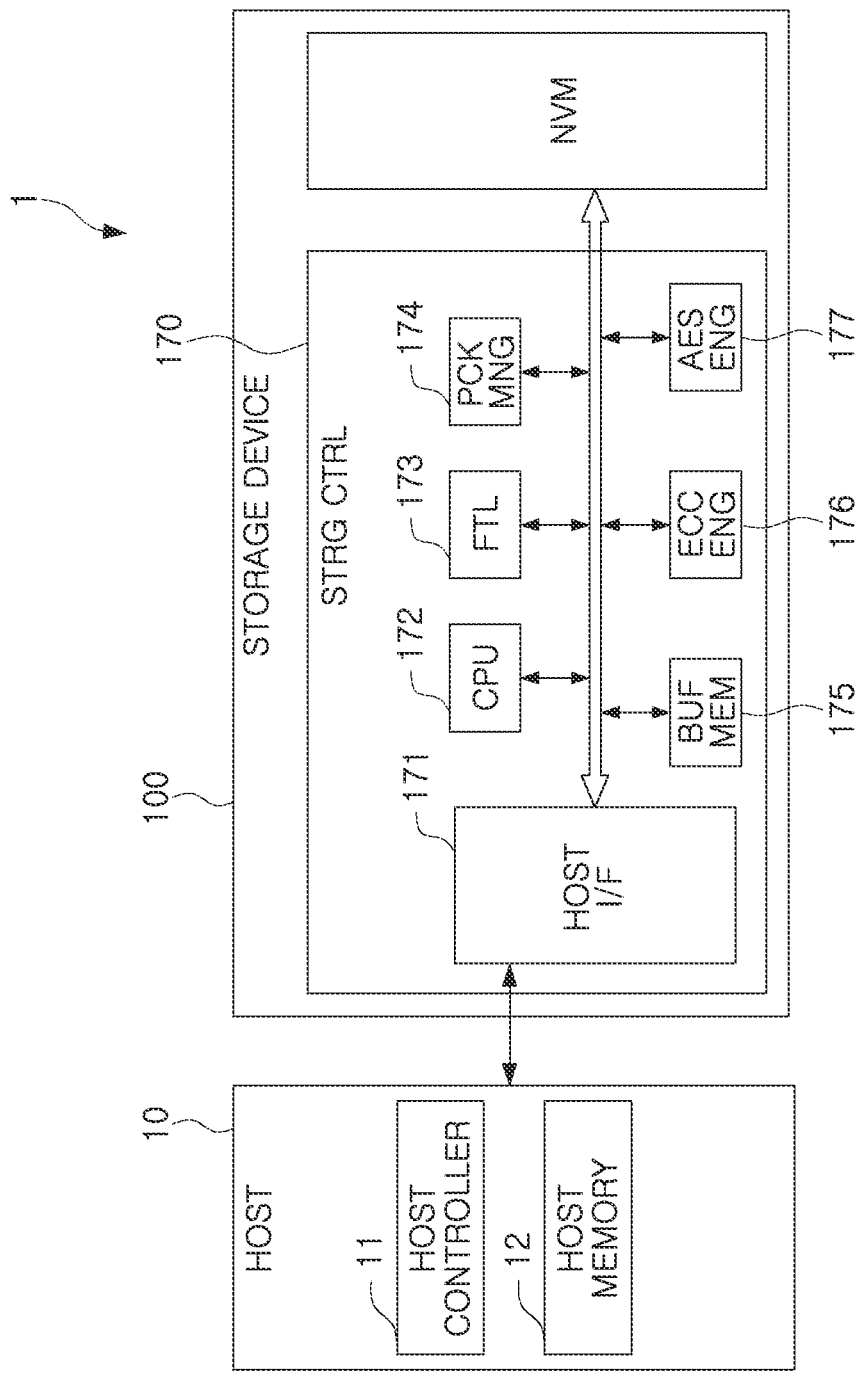
FIG. 2 is a block diagram schematically illustrating a host-storage system illustrating the storage device according to the exemplary embodiment in the present disclosure.

FIG. 2 is a block diagram schematically illustrating a host-storage system illustrating the storage device according to the exemplary embodiment in the present disclosure.

Referring to FIG. 2, a host-storage system 1 may include a host 10 and the storage device 100 according to the exemplary embodiment in the present disclosure. In addition, the storage device 100 may include the memory controller 170 and the non-volatile memory (NVM). For example, the memory controller 170 may correspond to the memory controller 170 illustrated in FIG. 1 and the non-volatile memory (NVM) may correspond to the first cell area 140 and the peripheral circuit area 150 illustrated in FIG. 1.

Also, according to the exemplary embodiment in the present disclosure, the host 10 may include a host controller 11 and a host memory 12. The host memory 12 may function as a buffer memory for temporarily storing data to be transmitted to the storage device 100 or data transmitted from the storage device 100.

The storage device 100 may include a solid state drive (SSD) as a storage medium for storing data according to a request from the host 10. In this case, the storage device 100 may be a device conforming to the NVMe standard. The host 10 and the storage device 100 may generate a packet according to an adopted standard protocol and transmit the generated packet.

However, this is only an example and may not be limited. For example, the storage device 100 may be implemented in various interface schemes such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), eMMC, UFS, embedded universal flash storage (eUFS), and compact flash (CF).

When the non-volatile memory (NVM) of the storage device 100 includes a flash memory, the flash memory may include a 3D (or vertical) NAND (VNAND) memory cell array. As another example, the storage device 100 may include other various types of non-volatile memories. For example, the storage device 100 may include a NOR flash memory, a resistive random access memory (RRAM), a phase-change RAM (PRAM), a magnetoresistive RAM (MRAM), a ferroelectric random access memory (FRAM), a spin transfer torque random access memory (STT-RAM), and other various types of memory devices.

According to an exemplary embodiment, the host controller 11 and the host memory 12 may be implemented as separate semiconductor chips. Alternatively, in some exemplary embodiments, the host controller 11 and the host memory 12 may be integrated on the same semiconductor chip. As an example, the host controller 11 may be any one of a plurality of modules included in an application processor and the application processor may be implemented as a system on chip (SoC). In addition, the host memory 12 may be an embedded memory provided in the application processor or a non-volatile memory or a memory module disposed outside the application processor.

The host controller 11 may manage an operation of storing data (e.g., write data) of the buffer area of the host memory 12 in the non-volatile memory (NVM) or data (e.g., read data) of the non-volatile memory (NVM) in the buffer area.

The memory controller 170 included in the storage device 100 according to the exemplary embodiment in the present disclosure may include a host interface 171 and a central processing unit (CPU) 172. In addition, the memory controller 170 may further include a flash translation layer (FTL) 173, a packet manager 174, a buffer memory 175, an error correction code (ECC) engine 176, and an advanced encryption standard (AES) engine 177. The memory controller 170 may further include a working memory into which the flash translation layer 173 is loaded, and the CPU 172 may execute the flash translation layer 173 to control a write operation and a read operation to the non-volatile memory (NVM).

The host interface 171 may transmit and receive packets to and from the host 10. A packet transmitted from the host 10 to the host interface 171 may include a command, data to be written to the non-volatile memory (NVM) or the like, and a packet transmitted from the host interface 171 to the host 10 may include a response to the command, data read from the non-volatile memory (NVM), or the like.

The memory controller 170 of the storage device 100 according to the exemplary embodiment in the present disclosure may transmit data to be written to the non-volatile memory (NVM) to the non-volatile memory (NVM) or receive data read from the non-volatile memory (NVM). Meanwhile, the memory controller 170 may convert a command received from the host 10 into a control signal. Since the storage device 100 is implemented as a single chip, it is possible to directly control the non-volatile memory (NVM) in the form of the control signal without a separate chip interface.

The flash translation layer 173 may perform various functions such as address mapping, wear-leveling, and garbage collection. The address mapping operation is an operation of changing a logical address received from the host 10 into a physical address used to store data in the non-volatile memory (NVM). The wear-leveling is a technique for preventing excessive deterioration in a specific block by allowing blocks in the non-volatile memory (NVM) to be uniformly used and may be implemented by, for example, a firmware technique for balancing erase counts of physical blocks. The garbage collection is a technique for securing usable capacity in the non-volatile memory (NVM) by copying valid data of a block to a new block and then erasing an existing block.

The packet manager 174 may generate a packet according to the protocol of the interface negotiated with the host 10 or parse various types of information from the packet received from the host 10. In addition, the buffer memory 175 may temporarily store data to be written to the non-volatile memory (NVM) or data to be read from the non-volatile memory (NVM).

The buffer memory 175 may be provided in the memory controller 170 but may be disposed outside the memory controller 170. That is, the buffer memory 175 may be distinguished from the buffer memory implemented by the second cell area 160 illustrated in FIG. 1. However, this is only an exemplary embodiment and is not limited thereto and the storage device 100 includes both the buffer memory included in the second semiconductor structure 120 and the buffer memory 175 included in the third semiconductor structure 130 or includes only the buffer memory included in the second semiconductor structure 120.

The ECC engine 176 may perform an error detection and correction function on data read from the non-volatile memory (NVM). More specifically, the ECC engine 176 may generate parity bits for write data to be written into the non-volatile memory (NVM) and the generated parity bits may be stored in the non-volatile memory (NVM) together with the write data. During the data read operation in the non-volatile memory (NVM), the ECC engine 176 may correct the error in the read data using the parity bits read together with the data read from the non-volatile memory (NVM) and output the error-corrected read data.

The AES engine 177 may perform at least one of an encryption operation and a decryption operation on data input to the memory controller 170 using a symmetric-key algorithm.

Figure 3:
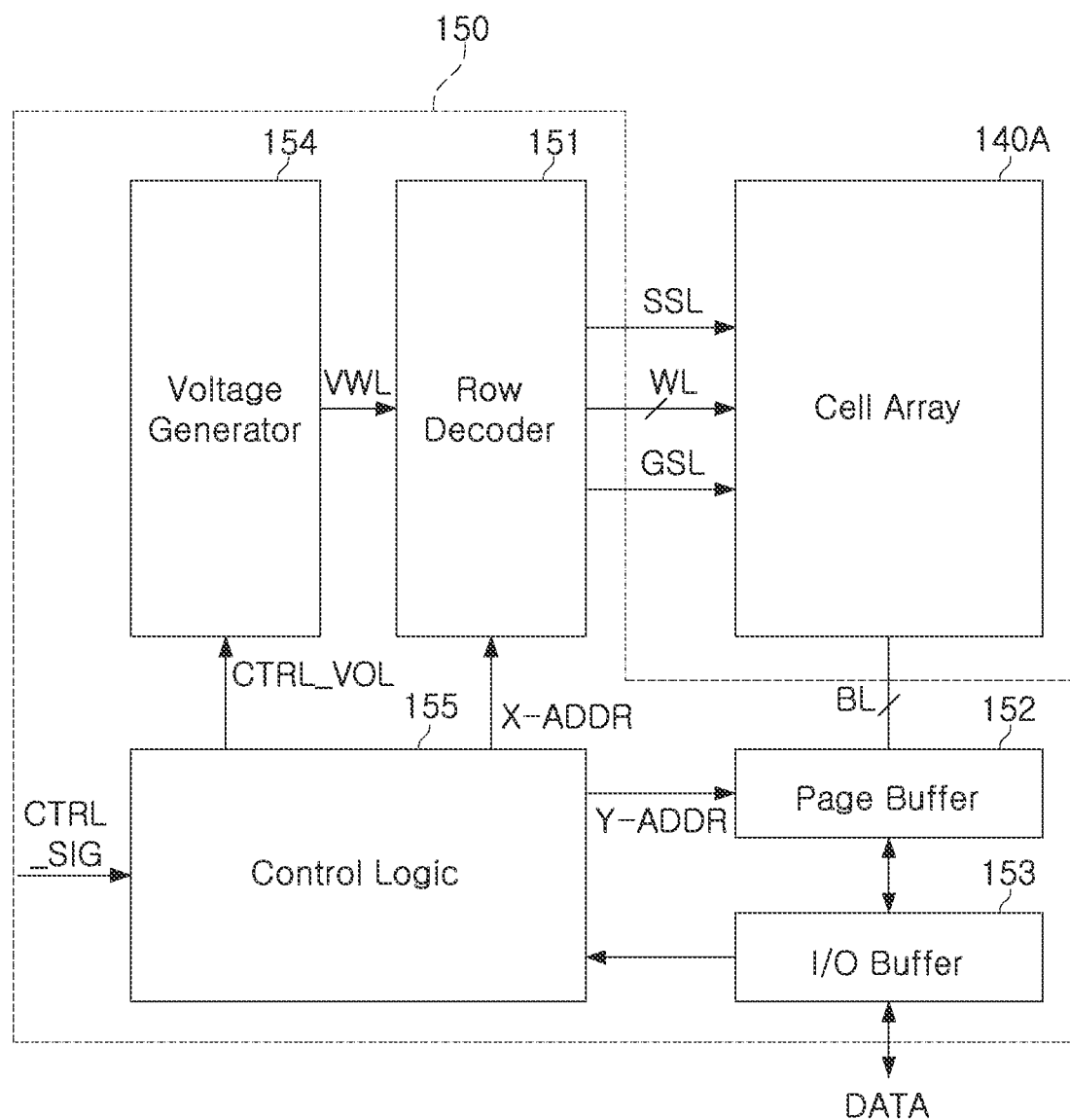
FIG. 3 is a block diagram schematically illustrating a non-volatile memory included in the storage device according to the exemplary embodiment in the present disclosure.

FIG. 3 is a block diagram schematically illustrating a non-volatile memory included in the storage device according to the exemplary embodiment in the present disclosure.

Referring to FIG. 3, the non-volatile memory included in the storage device 100 according to the exemplary embodiment in the present disclosure may include a first cell area including a memory cell array 140A and a peripheral circuit area 150 including peripheral circuits.

The peripheral circuit area 150 of the non-volatile memory may include a row decoder 151, a page buffer 152, an input/output buffer 153, a voltage generator 154, and a control logic circuit 155. Although not illustrated in FIG. 3, the non-volatile memory may further include column logic, a pre-decoder, a temperature sensor, and the like.

The control logic circuit 155 may generally control various operations in a non-volatile memory. For example, the control logic circuit 155 may output a voltage control signal CTRL_VOL, a row address X-ADDR, and a column address Y-ADDR.

The memory cell array 140A may include a plurality of memory blocks, and each of the plurality of memory blocks may include a plurality of first memory cells. The memory cell array 140A may be connected to the buffer 152 through bit lines BL and connected to a row decoder 151 through word lines WL, string selection lines SSL, and ground selection lines GSL.

In the storage device 100 according to the exemplary embodiment in the present disclosure, the memory cell array 140A may include a 3D memory cell array and the 3D memory cell array may include a plurality of NAND strings. Each NAND string may include the plurality of first memory cells respectively connected to word lines WL stacked vertically on a substrate. U.S. Pat. Nos. 7,679,133, 8,553, 466, 8,654,587, and 8,559,235, and U.S. Patent Application Publication No. 2011/0233648 are incorporated herein by reference in their entirety. As an exemplary embodiment, the memory cell array 140A may include a 2-dimensional (2D) memory cell array and the 2D memory cell array may include a plurality of NAND strings disposed along a row direction and a column direction.

The page buffer 152 may include a plurality of page buffers, and the plurality of page buffers may be respectively connected to the plurality of first memory cells through a plurality of bit lines BL. The page buffer 152 may select at least one of the bit lines BL in response to a column address Y-ADDR. The page buffer 152 may operate as a write driver or a sense amplifier according to an operation mode. For example, during the write operation, the page buffer 152 may apply a bit line voltage corresponding to data to be written to the selected bit line. During the read operation, the page buffer 152 may sense data stored in the first memory cell by sensing a current or voltage of the selected bit line.

The voltage generator 154 may generate various types of voltages for performing write, read, write verify, and erase operations based on the voltage control signal CTRL_VOL. For example, the voltage generator 154 may generate a write voltage, a read voltage, a write verify voltage, an erase voltage, etc., as a word line voltage VWL.

The row decoder 151 may select one of the plurality of word lines WL in response to the row address X-ADDR and select one of the plurality of string selection lines SSL. For example, the row decoder 151 may apply the write voltage and the write verify voltage to the selected word line during the write operation and apply the read voltage to the selected word line during the read operation.

Figure 4:
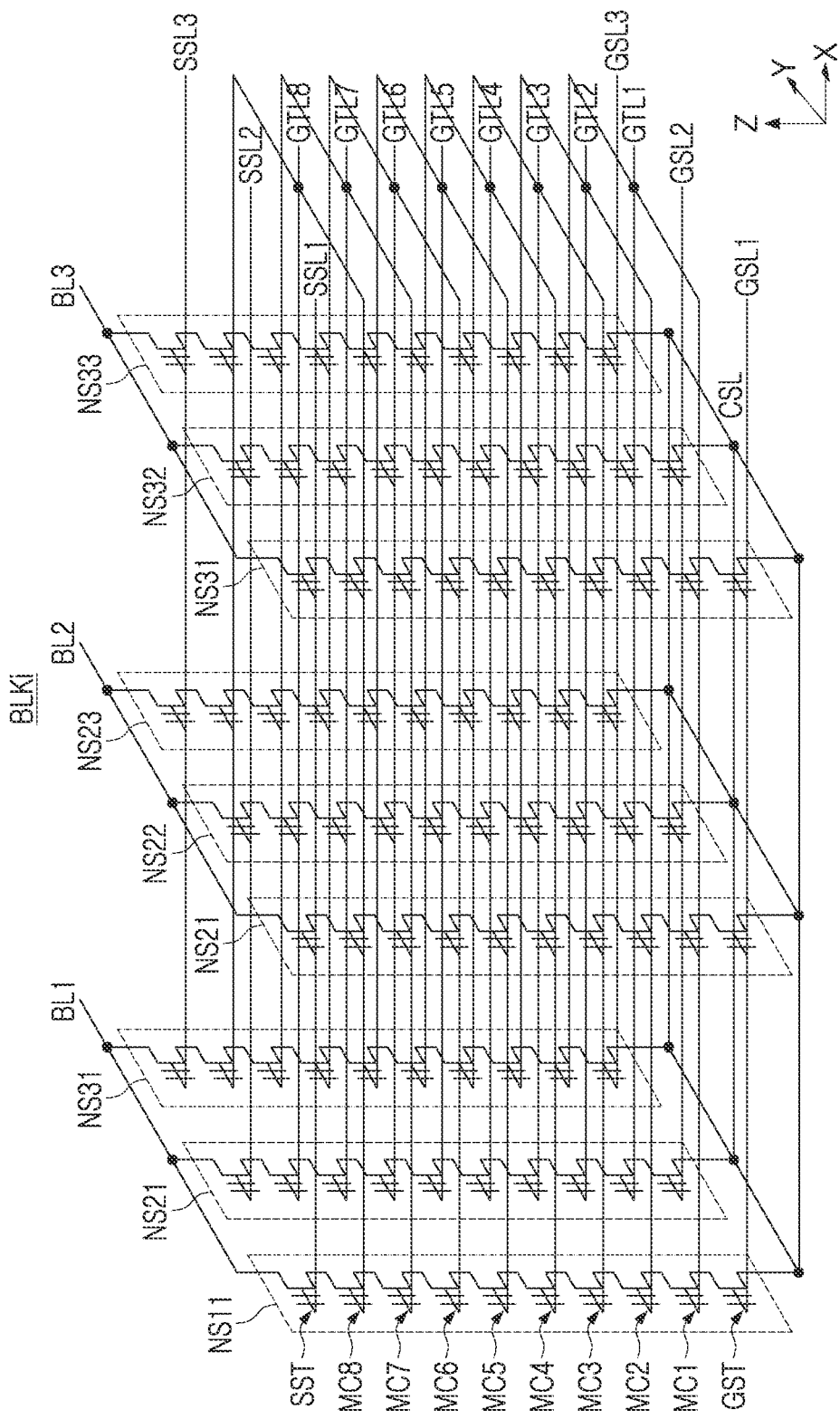
FIG. 4 is an equivalent circuit diagram of a memory block included in the non-volatile memory included in the storage device according to the exemplary embodiment in the present disclosure.

FIG. 4 is an equivalent circuit diagram of a memory block included in the non-volatile memory included in the storage device according to the exemplary embodiment in the present disclosure.

A memory block BLKi illustrated in FIG. 4 represents a three-dimensional memory block formed on a semiconductor substrate in a three-dimensional structure. For example, a plurality of memory NAND strings included in the memory block BLKi may be formed in a direction perpendicular to the semiconductor substrate.

Referring to FIG. 4, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. FIG. 4 illustrates that each of the plurality of memory NAND strings NS11 to NS33 includes eight memory cells MC1, MC2, . . . , MC8, but is not necessarily limited thereto.

The string select transistor SST may be connected to the corresponding string selection lines SSL1, SSL2, and SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to word lines, and some of the gate lines GTL1, GTL2, . . . , GTL8 may correspond to dummy word lines. The ground select transistor GST may be connected to the corresponding ground select lines GSL1, GSL2, and GSL3. The string select transistor SST may be connected to the corresponding bit lines BL1, BL2, and BL3, and the ground select transistor GST may be connected to the common source line CSL.

Word lines (e.g., WL1) having the same height are commonly connected, and the ground selection lines GSL1, GSL2, and GSL3 and the string selection lines SSL1, SSL2, and SSL3 may each be separated from each other. FIG. 4 illustrates that the memory block BLK is connected to eight gate lines GTL1, GTL2, . . . , GTL8 and three bit lines BL1, BL2, BL3, but is not necessarily limited thereto.

Figure 5:
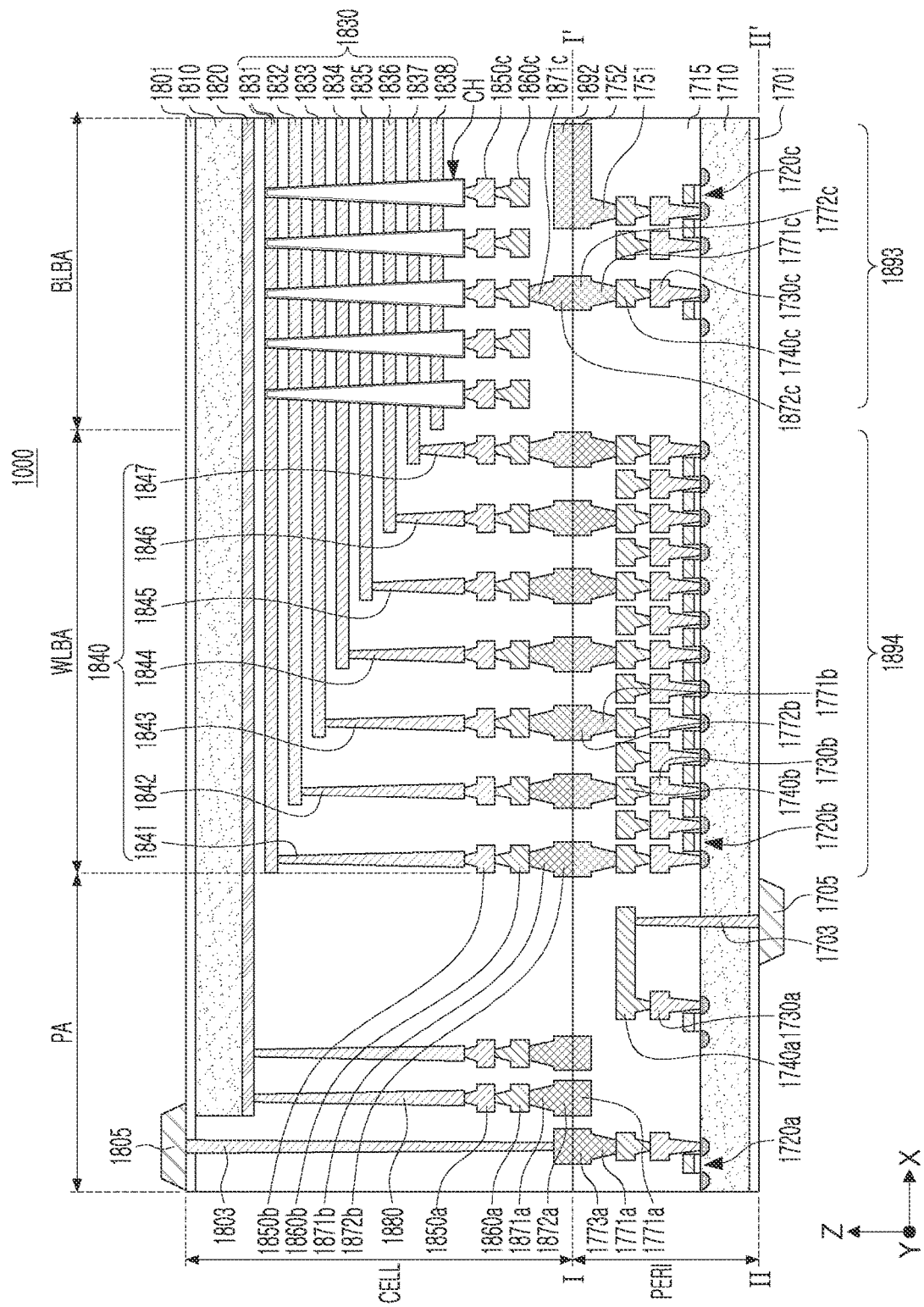
FIG. 5 is a diagram illustrating a wafer bonding method in the storage device according to the exemplary embodiment in the present disclosure.

FIG. 5 is a diagram illustrating a wafer bonding method in the storage device according to the exemplary embodiment in the present disclosure.

Referring to FIG. 5, a non-volatile memory 1000 may have a chip to chip (C2C) structure. The C2C structure may mean that an upper chip including a cell area CELL is manufactured on a first wafer and a lower chip including a peripheral circuit area PERI is manufactured on a second wafer different from the first wafer, and then the upper chip and the lower chip are connected to each other by a bonding method. For example, the bonding method may refer to a method of electrically connecting a bonding metal formed on an uppermost metal layer of the upper chip and a bonding metal formed on an uppermost metal layer of the lower chip. For example, when the bonding metal is formed of copper (Cu), the bonding method may be a Cu-to-Cu bonding method, and the bonding metal may also be formed of aluminum (Al) or tungsten (W).

Referring to FIGS. 1 and 5 together, a cell area CELL included on a first wafer of the non-volatile memory 1000 may correspond to the first cell area 140 and a peripheral circuit area PERI included on a second wafer may correspond to the peripheral circuit area 150. In addition, the bonding metal may correspond to the first metal pad 113 and the second metal pad 123.

Each of the peripheral circuit area PERI and the cell area CELL of the non-volatile memory 1000 may include an outer pad bonding area PA, a word line bonding area WLBA, and a bit line bonding area BLBA.

The peripheral circuit area PERI may include the second semiconductor substrate 1710, an interlayer insulating layer 1715, a plurality of circuit elements 1720*a*, 1720*b*, and 1720*c* formed on the second semiconductor substrate 1710, first metal layers 1730*a*, 1730*b*, and 1730*c* connected to the plurality of circuit elements 1720*a*, 1720*b*, and 1720*c*, respectively, and second metal layers 1740*a*, 1740*b*, and 1740*c* formed on the first metal layers 1730*a*, 1730*b*, and 1730*c*. In an exemplary embodiment, the first metal layers 1730*a*, 1730*b*, and 1730*c* may be formed of tungsten having a relatively high electrical specific resistance and the second metal layers 1740*a*, 1740*b*, and 1740*c* may be formed of copper having a relatively low electrical specific resistance.

In the present specification, only the first metal layers 1730*a*, 1730*b*, and 1730*c* and the second metal layers 1740*a*, 1740*b*, and 1740*c* are illustrated and described, but not limited thereto, and at least one metal layer may be further formed on the second metal layers 1740*a*, 1740*b*, and 1740*c*. At least some of the one or more metal layers formed above the second metal layers 1740*a*, 1740*b*, and 1740*c* may be formed of aluminum having a different electrical specific resistance, etc., than that of copper forming the second metal layers 1740*a*, 1740*b*, and 1740*c*.

The interlayer insulating layer 1715 may be disposed on the second semiconductor substrate 1710 to cover the plurality of circuit elements 1720*a*, 1720*b*, and 1720*c*, the first metal layers 1730*a*, 1730*b*, and 1730*c*, and the second metal layers 1740*a*, 1740*b*, and 1740*c* and may include an insulating material such as silicon oxide or silicon nitride.

Lower bonding metals 1771*b* and 1772*b* may be formed on the second metal layer 1740*b* of the word line bonding area WLBA. In the word line bonding area WLBA, the lower bonding metals 1771*b* and 1772*b* of the peripheral circuit area PERI may be electrically connected to upper bonding metals 1871*b* and 1872*b* of the cell area CELL by the bonding method, and the lower bonding metals 1771*b* and 1772*b* and the upper bonding metals 1871*b* and 1872*b* may be formed of aluminum, copper, tungsten, or the like.

The cell area CELL may provide at least one memory block. The cell area CELL may include a first semiconductor substrate 1810 and a common source line 1820. A plurality of word lines 1831 to 1838 (1830) may be stacked on the first semiconductor substrate 1810 along a direction (Z-axis direction) perpendicular to an upper surface of the first semiconductor substrate 1810. String selection lines and a ground selection line may be disposed above and below the word lines 1830, respectively, and the plurality of word lines 1830 may be disposed between the string selection lines and the ground selection line.

In the bit line bonding area BLBA, the channel structure CH may extend in a direction (Z-axis direction) perpendicular to the upper surface of the first semiconductor substrate 1810 to penetrate through the word lines 1830, the string selection lines, and the ground selection line. The channel structure CH may include a data storage layer, a channel layer, a buried insulation layer, and the like, and the channel layer may be electrically connected to a first metal layer 1850*c* and a second metal layer 1860*c*. For example, the first metal layer 1850*c* may be a bit line contact and the second metal layer 1860*c* may be a bit line. In an exemplary embodiment, the bit line 1860*c* may extend in a third direction (e.g., Y direction) parallel to an upper surface of the first semiconductor substrate 1810.

In an exemplary embodiment illustrated in FIG. 5, an area in which the channel structure CH, the bit line 1860*c*, and the like are disposed may be defined as a bit line bonding area BLBA. The bit line 1860*c* may be electrically connected to the circuit elements 1720*c* providing a page buffer 1893 in the peripheral circuit area PERI in the bit line bonding area BLBA. For example, the bit line 1860*c* may be connected to the upper bonding metals 1871*c* and 1872*c* in the peripheral circuit area PERI and the upper bonding metals 1871*c* and 1872*c* may be connected to the lower bonding metals 1771*c* and 1772*c* that are connected to the circuit elements 1720*c* of the page buffer 1893.

In the word line bonding area WLBA, the word lines 1830 may extend along the second direction (X-axis direction) parallel to the upper surface of the first semiconductor substrate 1810 while being perpendicular to the third direction and may be connected to a plurality of cell contact plugs 1841 to 1847 (1840). The word lines 1830 and the cell contact plugs 1840 may be connected to each other through pads provided by at least some of the word lines 1830 extending in different lengths along the second direction. A first metal layer 1850*b* and a second metal layer 1860*b* may be sequentially connected to the cell contact plugs 1840 connected to the word lines 1830. The cell contact plugs 1840 may be connected to the peripheral circuit area PERI through the upper bonding metals 1871*b* and 1872*b* of the cell area CELL in the word line bonding area WLBA and the lower bonding metal 1771*b* and 1772*b* of the peripheral circuit area PERI.

The cell contact plugs 1840 may be electrically connected to the circuit elements 1720*b* forming the row decoder 1894 in the peripheral circuit area PERI. The operating voltage of the circuit elements 1720*b* providing the row decoder 1894 may be different from that of the circuit elements 1720*c* forming the page buffer 1893. For example, the operating voltage of the circuit elements 1720*c* forming the page buffer 1893 may be greater than that of the circuit elements 1720*b* forming the row decoder 1894.

A common source line contact plug 1880 may be disposed in the outer pad bonding area PA. The common source line contact plug 1880 may be formed of a metal, a metal compound, or a conductive material such as polysilicon and may be electrically connected to the common source line 1820. A first metal layer 1850*a* and a second metal layer 1860*a* may be sequentially stacked above the common source line contact plug 1880 (as seen from an inverted aspect). For example, an area in which the common source line contact plug 1880, the first metal layer 1850*a*, and the second metal layer 1860*a* are disposed may be defined as the outer pad bonding area PA.

Meanwhile, input/output pads 1705 and 1805 may be disposed in the outer pad bonding area PA. Referring to FIG. 5, a lower insulating film 1701 covering a lower surface of the second semiconductor substrate 1710 may be formed under the second semiconductor substrate 1710 and the second input/output pad 1705 may be formed on the lower insulating film 1701. The second input/output pad 1705 may be connected to at least one of the plurality of circuit elements 1720*a*, 1720*b*, and 1720*c* disposed in the peripheral circuit area PERI through the second input/output contact plug 1703 and may be separated from the second semiconductor substrate 1710 by the lower insulating film 1701. In addition, since a side insulating film may be disposed between the second input/output contact plug 1703 and the second semiconductor substrate 1710, the second input/output contact plug 1703 and the second semiconductor substrate 1710 may be electrically separated from each other.

Referring to FIG. 5, an upper insulating film 1810 covering an upper surface of the first semiconductor substrate 1810 may be formed above the first semiconductor substrate 1801 and the first input/output pad 1805 may be disposed on the upper insulating film 1801. The first input/output pad 1805 may be connected to at least one of the plurality of circuit elements 1720a, 1720b, and 1720c disposed in the peripheral circuit area PERI through a first input/output contact pad 1803. In an exemplary embodiment, the first input/output pad 1805 may be electrically connected to the circuit element 1720a.

According to an exemplary embodiment, the first semiconductor substrate 1801, the common source line 1820, and the like may not be disposed in the area where the first input/output contact plug 1803 is disposed. In addition, the first input/output pad 1805 may not overlap with the word lines 1830 in the first direction (e.g., Z direction). Referring to FIG. 5, the first input/output contact plug 1803 may be separated from the first semiconductor substrate 1810 in a direction parallel to the upper surface of the first semiconductor substrate 1810 and may be connected to the first input/output pad 1805 by penetrating through the interlayer insulating layer 1715 of the cell area CELL.

According to exemplary embodiments, the second input/output pad 1705 and the first input/output pad 1805 may be selectively formed. For example, the non-volatile memory 1000 may include only the second input/output pad 1705 disposed above the lower insulating film 1701, or only the first input/output pad 1805 disposed above the upper insulating film 1801. Alternatively, the non-volatile memory 1000 may include both the second input/output pad 1705 and the first input/output pad 1805.

The metal pattern of the uppermost metal layer may exist as a dummy pattern in each of the outer pad bonding area PA and the bit line bonding area BLBA included in each of the cell area CELL and the peripheral circuit area PERI, or the uppermost metal layer may be empty.

In the non-volatile memory 1000, a lower metal pattern 1773a having the same shape as the upper metal pattern 1872a of the cell area CELL may be formed on the uppermost metal layer of the peripheral circuit area PERI to correspond to the upper metal pattern 1872a formed on the uppermost metal layer of the cell area CELL in the outer pad bonding area PA. The lower metal pattern 1773a formed on the uppermost metal layer of the peripheral circuit area PERI may not be connected to a separate contact in the peripheral circuit area PERI. Similarly, the upper metal pattern 1872a having the same shape as the lower metal pattern 1773a of the peripheral circuit area PERI may be formed on the upper metal layer of the cell area CELL to correspond to the lower metal pattern 1773a formed on the uppermost metal layer of the peripheral circuit area PERI in the outer pad bonding area PA.

Lower bonding metals 1771b and 1772b may be formed on the second metal layer 1740b of the word line bonding area WLBA. In the word line bonding area WLBA, the lower bonding metals 1771b and 1772b of the peripheral circuit area PERI may be electrically interconnected to upper bonding metals 1871b and 1872b of the cell area CELL by the bonding method.

In addition, in the bit line bonding area BLBA, an upper metal pattern 1892 having the same shape as the lower metal pattern 1752 of the peripheral circuit area PERI may be formed on the uppermost metal layer of the cell area CELL, corresponding to the lower metal pattern 1752 formed on an uppermost metal layer of the peripheral circuit area PERI. A contact may not be formed on the upper metal pattern 1892 formed on the uppermost metal layer of the cell area CELL.

However, the non-volatile memory 1000 illustrated in FIG. 5 is only an example illustrating the wafer bonding method, and the structure of the non-volatile memory 1000 according to the wafer bonding method may not be limited to that illustrated in FIG. 5.

Figure 6:
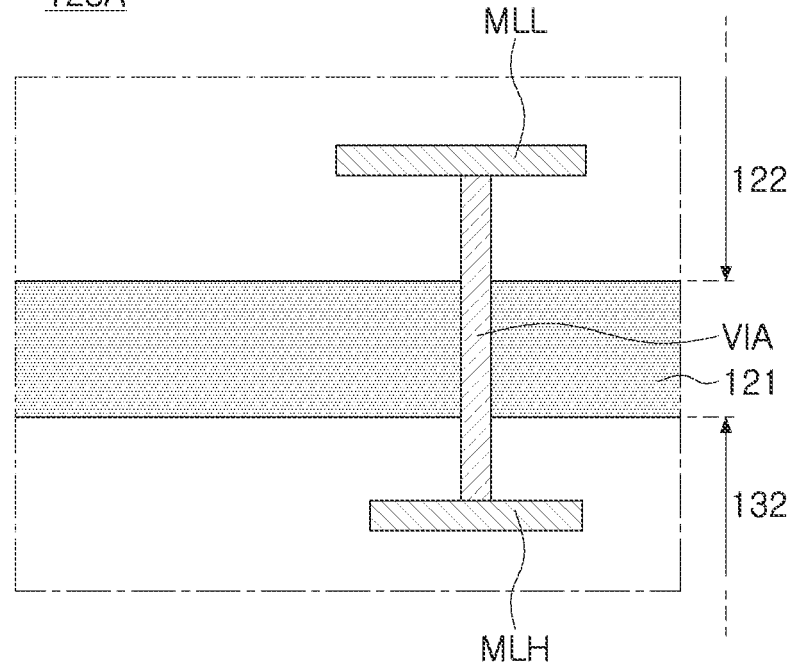
FIGS. 6 to 8 are simple diagrams illustrating a shape of a connection structure in the storage device according to the exemplary embodiment in the present disclosure.
Figure 7:
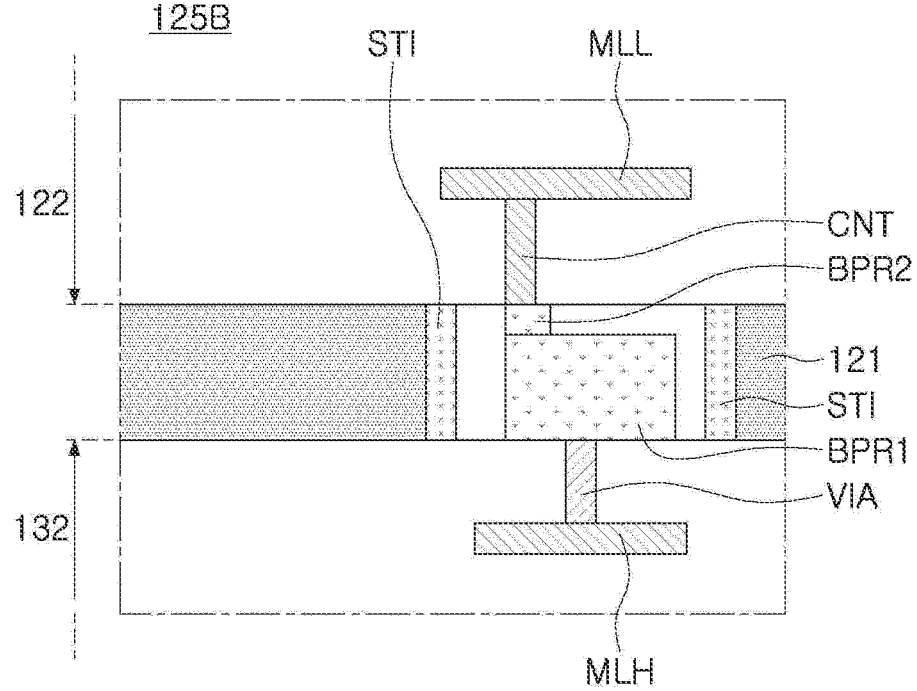
Figure 8:
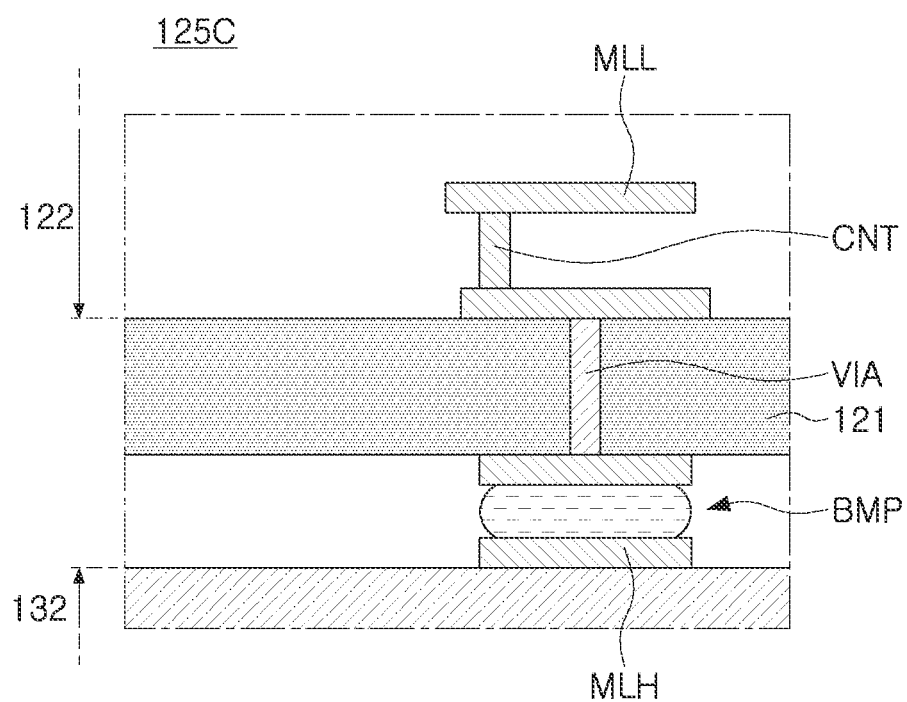

FIGS. 6 to 8 are simple diagrams illustrating a shape of a connection structure in the storage device according to the exemplary embodiment in the present disclosure.

Referring to FIG. 1, in the storage device 100 according to the exemplary embodiment in the present disclosure, the connection structure 125 connecting the second semiconductor structure 120 and the third semiconductor structure 130 may be formed in various structures according to exemplary embodiments.

Referring to FIG. 6, the connection structure 125A may have a structure that directly connects a lower interconnection layer MLL of the second semiconductor structure 120 and an upper interconnection layer MLH of the third semiconductor structure 130.

For example, a first via VIA in the form of a through hole via THV may penetrate through the second semiconductor substrate 121 and extend to the upper area 122 of the second semiconductor substrate to be connected to the lower interconnection layer MLL of the second semiconductor structure 120. Also, the first via VIA may extend to the upper area 132 of the third semiconductor substrate to be connected to the upper interconnection layer MLH of the third semiconductor structure 130.

Referring to FIG. 7, the connection structure 125B may have a structure in which the lower interconnection layer MLL of the second semiconductor structure 120 and the upper interconnection layer MLH of the third semiconductor structure 130 are connected through power rails BPR1 and BPR2 mounted between device isolation layers STI of the second semiconductor substrate 121.

For example, the second via VIA may connect between the mounted first power rail BPR1 and the upper interconnection layer MLH of the third semiconductor structure 130 and the mounted second power rail BPR2 electrically connected to the mounted first power rail BPR1 and the lower interconnection layer MLL of the second semiconductor structure 120 may be connected by a contact CNT.

Referring to FIG. 8, the connection structure 125C may be connected to pads disposed on the upper and lower surfaces of the second semiconductor substrate 121, respectively, the pad disposed on the upper surface of the second semiconductor substrate 121 may be connected to the lower interconnection layer MLL of the second semiconductor structure 120, and the pad disposed on the lower surface of the second semiconductor substrate 121 may be connected to the third semiconductor structure 130 through the bump BMP.

For example, the third via VIA in the form of the through hole via THV may penetrate through the second semiconductor substrate 121 to be connected to the pads disposed on the upper and lower surfaces of the second semiconductor substrate 121, respectively. The lower interconnection layer MLL of the second semiconductor structure 120 may be connected to the pad disposed on the upper surface of the second semiconductor substrate 121 through the contact CNT.

However, the structures of the connection structures 125A, 125B, and 125C illustrated in FIGS. 6 to 8 are merely exemplary embodiments and may not be limited. In the storage device 100 according to the exemplary embodiment in the present disclosure, the connection structure 125 electrically connecting the second semiconductor structure 120 and the third semiconductor structure 130 may be formed in various structures according to the process.

Figure 9:
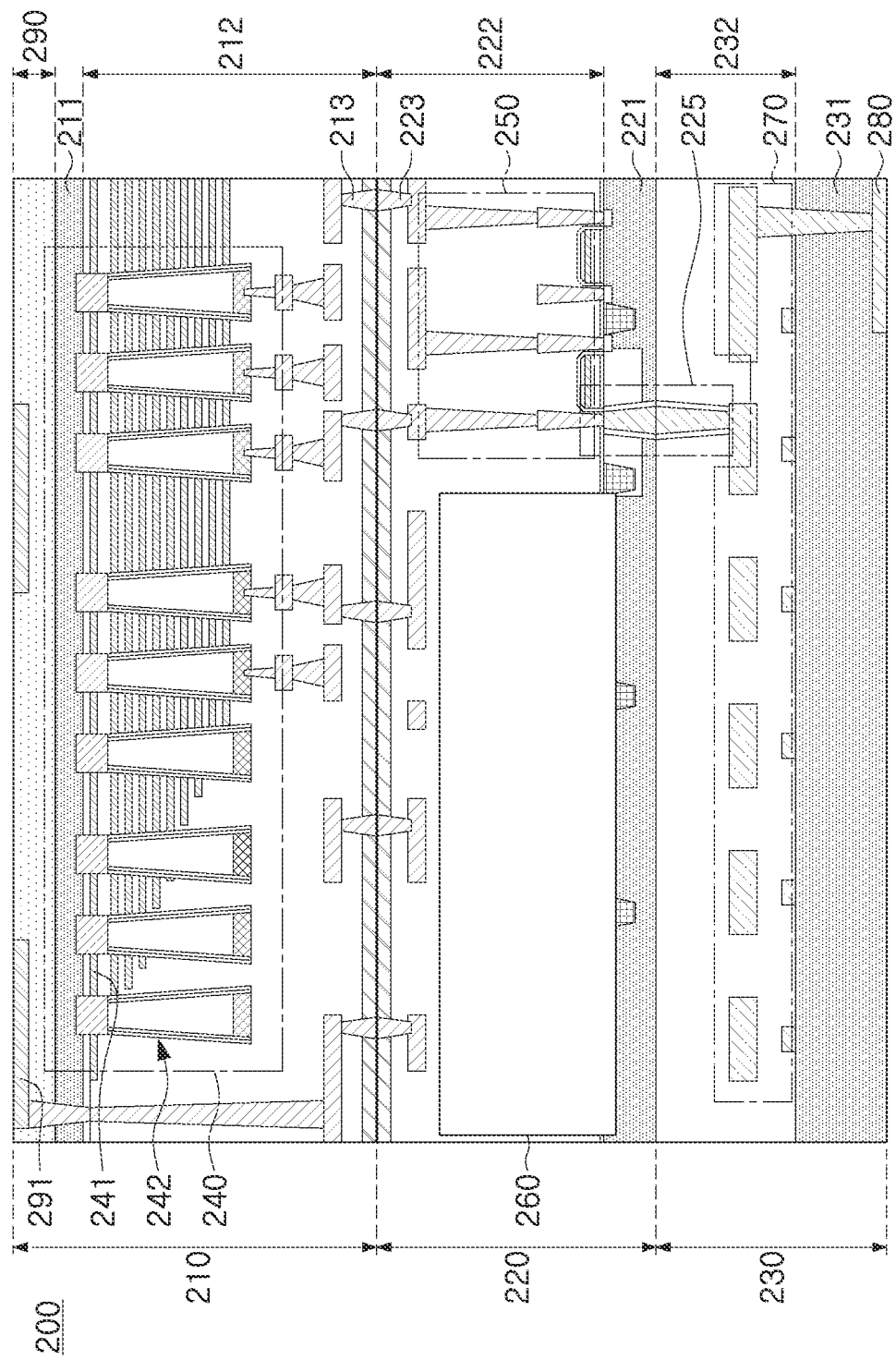
FIG. 9 is a cross-sectional view schematically illustrating a storage device according to another exemplary embodiment in the present disclosure.

FIG. 9 is a cross-sectional view schematically illustrating a storage device according to another exemplary embodiment in the present disclosure.

Referring to FIG. 9, a storage device 200 according to another exemplary embodiment in the present disclosure may correspond to the storage device 100 illustrated in FIG. 1. For example, the storage device 200 may include a first semiconductor structure 210, a second semiconductor structure 220, and a third semiconductor structure 230. In addition, the first semiconductor structure 210 and the second semiconductor structure 220 may be bonded by the wafer bonding method by the first metal pad 213 and the second metal pad 223 and the second semiconductor structure 220 and the third semiconductor structure 230 may be electrically connected through the connection structure 225.

The first semiconductor structure 210 may include a first semiconductor substrate 211 and an upper area 212 of the first semiconductor substrate, and the upper area 212 of the first semiconductor substrate may include a first cell area 240 implemented as a VNAND memory by gate electrodes 241 and channel structures 242.

The second semiconductor structure 220 may include a second semiconductor substrate 221 and an upper area 222 of the second semiconductor substrate, and the upper area 222 of the second semiconductor substrate may include a peripheral circuit area 250 and a second cell area 260 operating as a buffer memory.

The third semiconductor structure 230 may include a third semiconductor substrate 231 and an upper area 232 of the third semiconductor substrate including a memory controller 270. The memory controller 270 may be connected to a third metal pad 280 disposed on a lower surface of the third semiconductor substrate 231 through a connection via penetrating through the third semiconductor substrate 231.

Meanwhile, the storage device 200 illustrated in FIG. 9 may further include a pad-out layer 290 disposed on the lower surface of the first semiconductor substrate 211 (as seen from an inverted aspect). The pad-out layer 290 may include one or more contact pads 291 for electrically connecting the first cell area 240 to an external circuit. Since the first semiconductor structure 210 and the second semiconductor structure 220 are electrically connected to each other by the wafer bonding method, an electrical signal of the external circuit applied to the contact pad 291 may be transmitted to the peripheral circuit area 250 and the second cell area 260 included in the second semiconductor structure 220. That is, the contact pad 291 may transmit an electrical signal between the non-volatile memory and the external circuit for pad-out.

Figure 10:
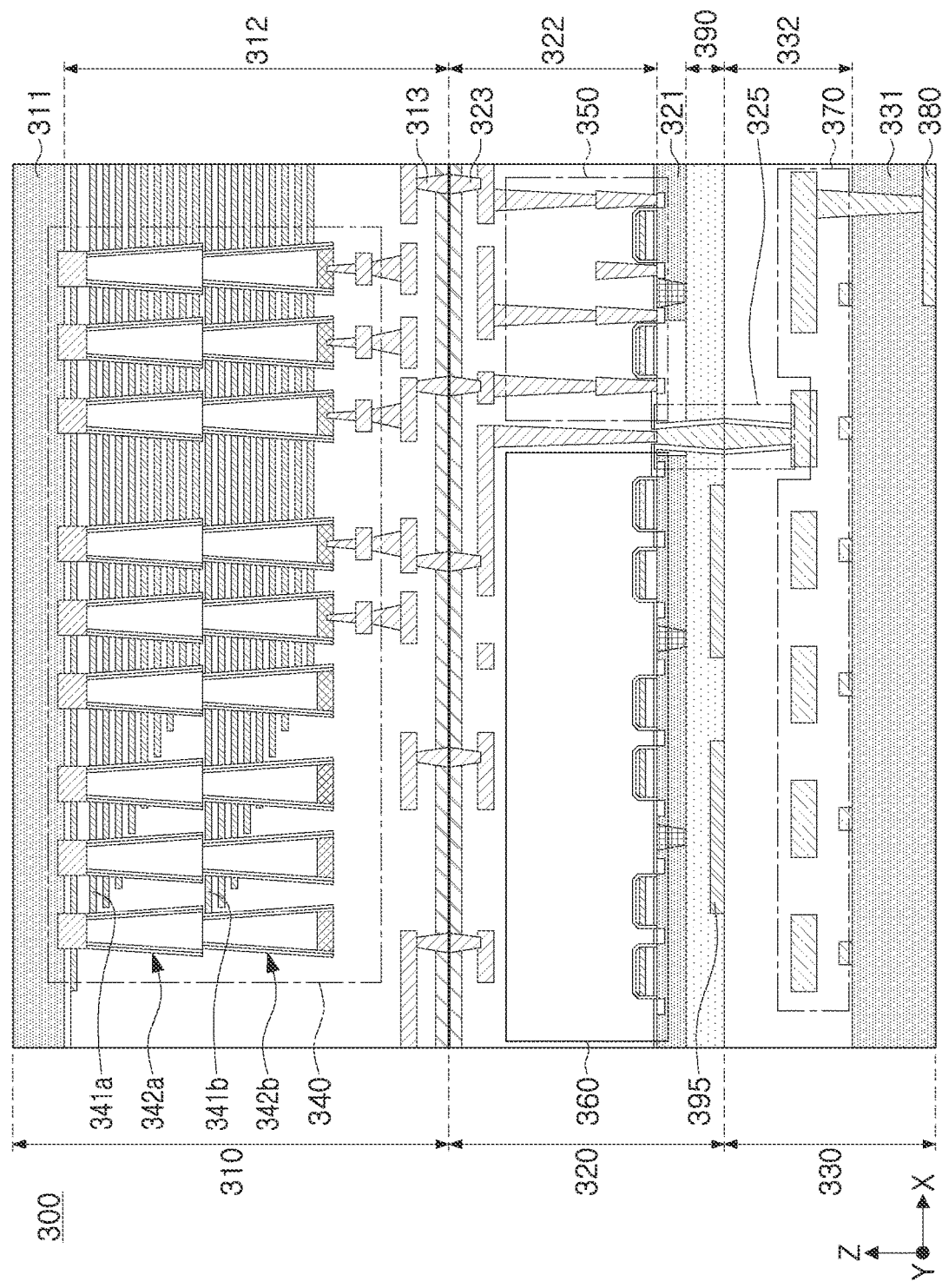
FIG. 10 is a cross-sectional view schematically illustrating a storage device according to another exemplary embodiment in the present disclosure.

FIG. 10 is a cross-sectional view schematically illustrating a storage device according to another exemplary embodiment in the present disclosure.

Referring to FIG. 10, a storage device 300 according to another exemplary embodiment may correspond to the storage device 100 illustrated in FIG. 1. For example, the storage device 300 may include a first semiconductor structure 310, a second semiconductor structure 320, and a third semiconductor structure 330. In addition, the first semiconductor structure 310 and the second semiconductor structure 320 may be bonded by the wafer bonding method by the first metal pad 313 and the second metal pad 323 and the second semiconductor structure 320 and the third semiconductor structure 330 may be electrically connected through the connection structure 325.

The first semiconductor structure 310 may include a first semiconductor substrate 311 and an upper area 312 of the first semiconductor substrate, and the upper area 312 of the first semiconductor substrate may include a first cell area 340 implemented as a VNAND memory by gate electrodes 341a and 341b and channel structures 342a and 342b.

In the storage device 300 according to the exemplary embodiment in the present disclosure, the channel structures 342a and 342b included in the first cell area 340 may be formed in a multi-stage structure. Accordingly, the gate electrodes 341a and 341b through which the channel structures 342a and 342b penetrate may also be additionally stacked along the channel structures 342a and 342b. The capacity of the non-volatile memory may be increased in the first cell area 340 of the storage device 300 by using the channel structures 342a and 342b formed in a multi-level structure.

The second semiconductor structure 320 may include a second semiconductor substrate 321 and an upper area 322 of the second semiconductor substrate, and the upper area 322 of the second semiconductor substrate may include a peripheral circuit area 350 and a second cell area 360 operating as a buffer memory. Meanwhile, a pad-out layer 390 including a contact pad 395 may be disposed on a lower surface of the second semiconductor substrate 321.

The third semiconductor structure 330 may include a third semiconductor substrate 331 and an upper area 332 of the third semiconductor substrate including a memory controller 370. The memory controller 370 may be connected to a third metal pad 380 disposed on a lower surface of the third semiconductor substrate 331 through a connection via penetrating through the third semiconductor substrate 331.

Figure 11:
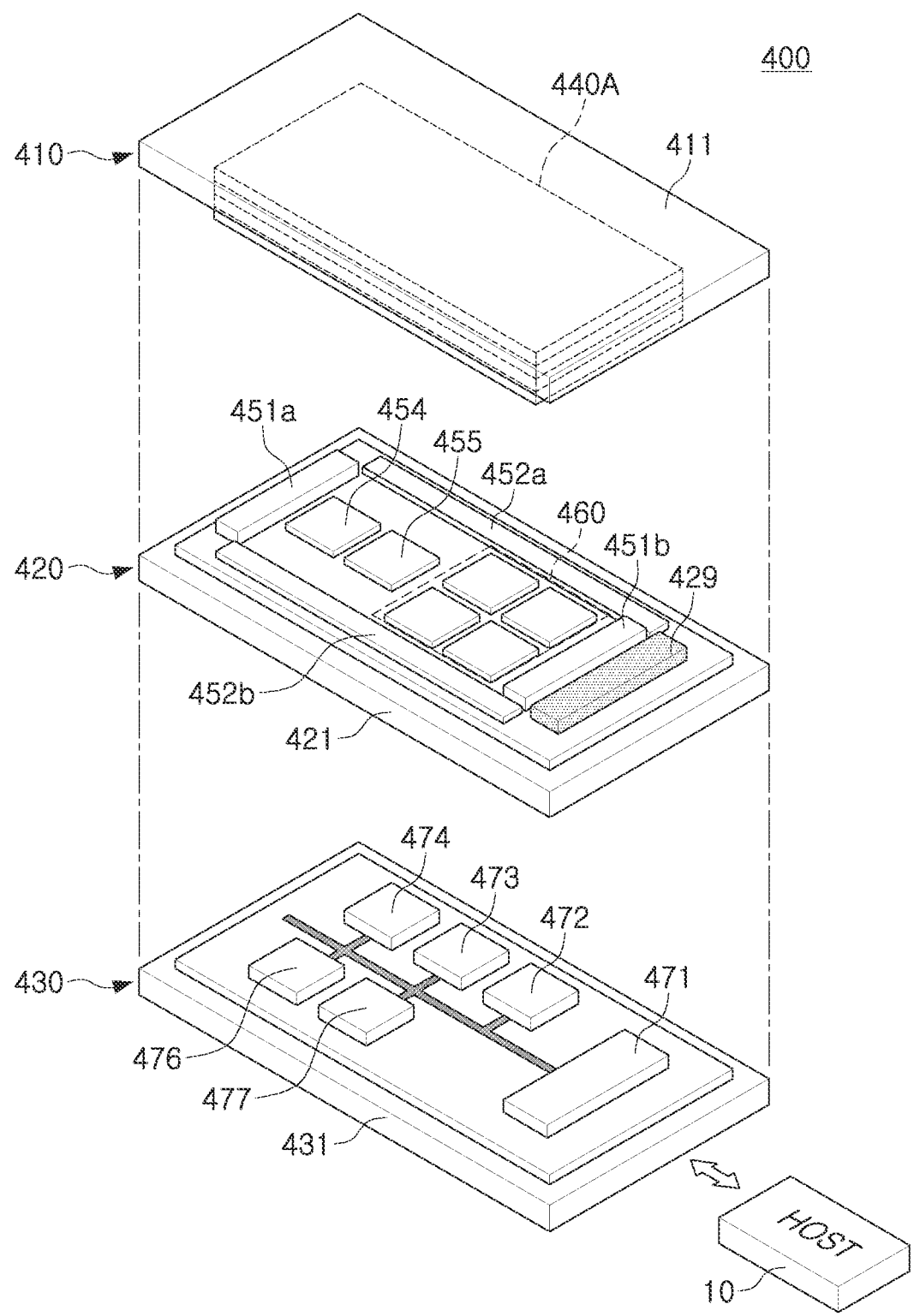
FIG. 11 is a diagram illustrating a write operation of the storage device according to the exemplary embodiment in the present disclosure.

FIG. 11 is a schematic perspective view illustrating the storage device according to the exemplary embodiment in the present disclosure.

Referring to FIG. 11, a storage device 400 according to an exemplary embodiment in the present disclosure may illustrate the storage device 100 illustrated in FIG. 1 as a structural unit in terms of operation. For example, the storage device 400 may include a first semiconductor structure 410, a second semiconductor structure 420, and a third semiconductor structure 430. The first semiconductor structure 410 may be bonded to the second semiconductor structure 420 by the wafer bonding method, and the second semiconductor structure 420 and the third semiconductor structure 430 may be electrically connected through a connection structure. The stacked structure of the storage device 400 may be the same as that of the storage device 100.

The first semiconductor structure 410 may include a memory cell array 440A including a plurality of first memory cells disposed on a first semiconductor substrate 411. The second semiconductor structure 420 may include peripheral circuits and a buffer memory 460 disposed on the second semiconductor substrate 421. The third semiconductor structure 430 may include a memory controller that is disposed on the third semiconductor substrate 431 and transmits data transmitted from the host 10 to the non-volatile memory.

A host interface 471, a CPU 472, a flash translation layer 473, a packet manager 474, the ECC engine 476, and an AES engine 477 disposed on the third semiconductor substrate 431 may correspond to each of the components included in the memory controller 170 illustrated in FIG. 2.

The peripheral circuits may control the plurality of first memory cells and may include row decoders 451a and 451b, page buffers 452a and 452b, a voltage generator 454, and a control logic circuit 455. The peripheral circuits may correspond to each of the components included in the peripheral circuit area 150 illustrated in FIG. 3.

Meanwhile, the buffer memory 460 including data to be stored in the plurality of first memory cells and a plurality of second memory cells temporarily storing data stored in the plurality of first memory cells may be a DRAM memory device. However, this is only an example and may not be limited.

On the second semiconductor substrate 421, peripheral circuits may be disposed outside the buffer memory 460, for example, the second cell area. For example, the peripheral circuits may be disposed closer to an edge of the second semiconductor substrate 421 than the second cell area. However, this is only an example and may not be limited.

A selection circuit 429 for controlling to selectively perform operations on the plurality of first memory cells or the plurality of second memory cells may be disposed on the second semiconductor substrate 421. In one example, the selection circuit 429 may be a multiplexer and/or a demultiplexer. The selection circuit 429 may determine whether to perform an operation on the plurality of second memory cells.

That is, the memory controller may set a data processing path using the selection circuit 429. Hereinafter, the operation of the memory controller is described in terms of the write operation, but the present disclosure is not limited thereto, and the memory controller may control the selection circuit 429 in a similar manner in the read operation.

For example, when the write operation of writing data transmitted from the host 10 to the plurality of first memory cells is performed, the memory controller may determine whether to write data to the plurality of first memory cells via the plurality of second memory cells or whether to write data to the plurality of first memory cells without passing through the plurality of second memory cells.

On the other hand, when the read operation of transmitting the data stored in the first memory cell to the host 10 is performed, the memory controller may determine whether to transmit data to the host 10 without passing through the plurality of second memory cells or whether to transmit data to the host 10 via the second memory cells.

The memory controller may determine whether to process the data via the plurality of second memory cells based on characteristics of data transmitted from the host 10 or data stored in the first memory cell on which the read operation is performed.

For example, when the data transmitted from the host 10 is sequence data or data requiring long-term storage, for example, cold data, the memory controller may control the selection circuit 429 to directly write data to the plurality of first memory cells without passing through the plurality of second memory cells.

On the other hand, when the data transmitted from the host 10 is periodically modified data, for example, hot data, the memory controller may control the selection circuit 429 to write data to the plurality of first memory cells via the plurality of second memory cells. For example, data may be temporarily stored in the plurality of second memory cells and then stored in the first memory cells.

For example, the cold data that is periodically modified or not frequently accessed, such as moving picture data, may be directly stored in the plurality of first memory cells without passing through the plurality of second memory cells. On the other hand, the hot data frequently accessed or frequently modified, such as logical to physical map data, may be stored in the plurality of second memory cells and then stored in the plurality of first memory cells. However, even the cold data may be handled as hot data when frequently accessed.

The memory controller may periodically process data in the plurality of second memory cells based on a difference between a speed at which data is transmitted and received to and from the host 10 and a speed at which data is processed in the plurality of first memory cells. In the case where a bottleneck occurs when data is transmitted and received to and from the host 10, data may be transmitted through the plurality of second memory cells. In this case, the memory controller may periodically store data in the plurality of second memory cells and read the data. For example, the bottleneck may occur when a speed at which data is read from the plurality of first memory cells to the memory controller is faster than a speed at which data is transmitted from the memory controller to the host 10, when a speed at which data is transmitted from the host 10 to the memory controller is slower than a speed at which the memory controller writes data to the plurality of first memory cells, or the like.

When data is stored in all of the plurality of second memory cells, the memory controller may store the data transmitted from the host 10 in the plurality of first memory cells without passing through the plurality of second memory cells.

Figure 12:
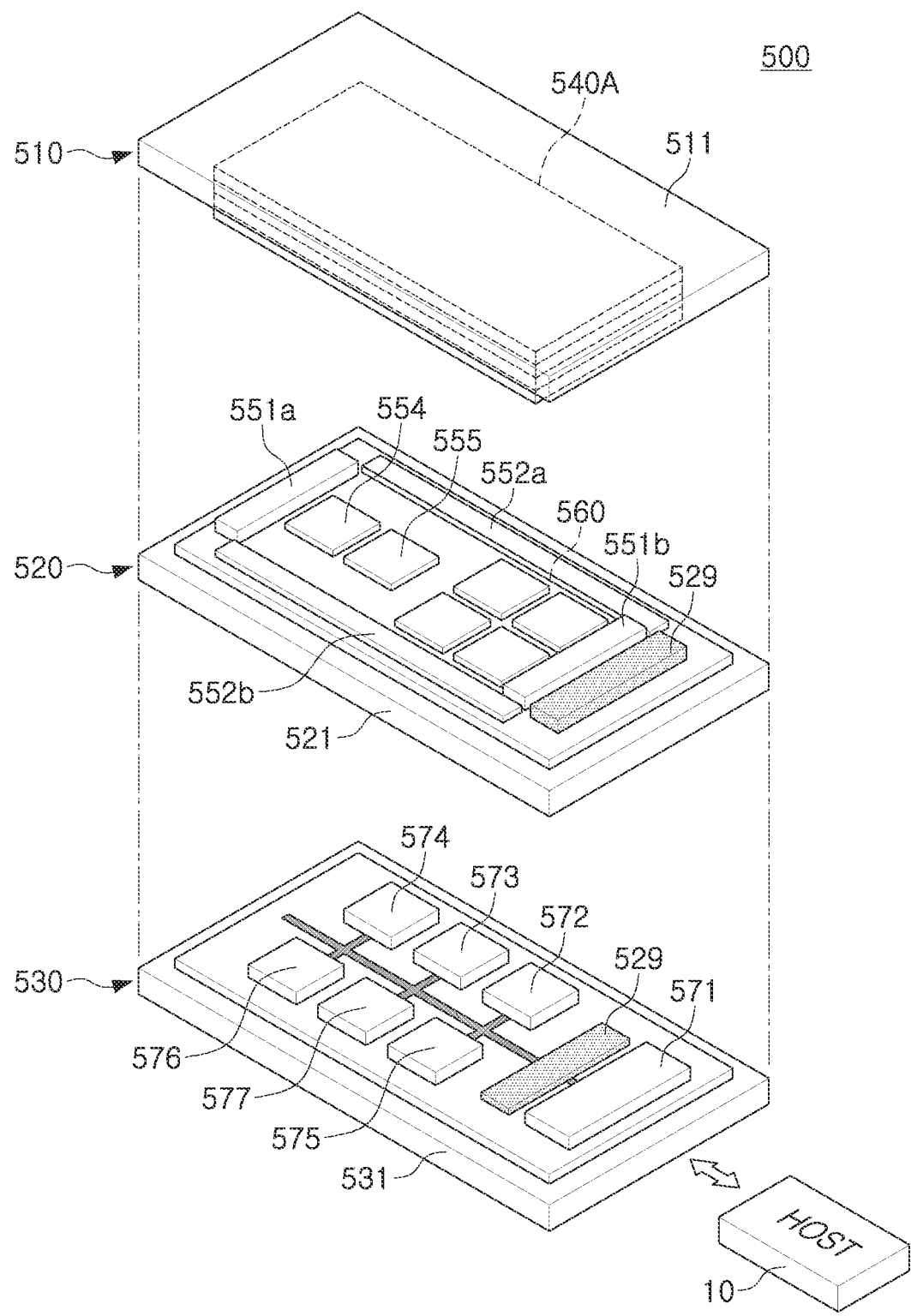
FIG. 12 is a flowchart illustrating the write operation of the storage device according to the exemplary embodiment in the present disclosure.

FIG. 12 is a schematic perspective view illustrating a storage device according to another exemplary embodiment in the present disclosure.

Referring to FIG. 12, a storage device 500 according to another exemplary embodiment may correspond to the storage device 400 illustrated in FIG. 11. For example, the storage device 500 may include a first semiconductor structure 510, a second semiconductor structure 520, and a third semiconductor structure 530. The first semiconductor structure 510 may be bonded to the second semiconductor structure 520 by the wafer bonding method, and the second semiconductor structure 520 and the third semiconductor structure 530 may be electrically connected through a connection structure. The stacked structure of the storage device 500 may be the same as that of the storage device 100 illustrated in FIG. 1.

In addition, the first semiconductor structure 510 may include a memory cell array 540A including a plurality of first memory cells arranged on a first semiconductor substrate 511. The second semiconductor structure 520 may include peripheral circuits and a buffer memory 560 disposed on the second semiconductor substrate 521. The third semiconductor structure 530 may include a memory controller that is disposed on the third semiconductor substrate 531 and transmits data transmitted from the host 10 to the non-volatile memory.

Meanwhile, the memory controller disposed on the third semiconductor substrate 531 may further include a static RAM (SRAM) 575 for specifying locations of data to be stored in the plurality of first memory cells and data stored in the plurality of first memory cells. A selection circuit 529 for controlling to selectively perform an operation on the static RAM 575 may be further disposed on the third semiconductor substrate 531.

Figure 13:
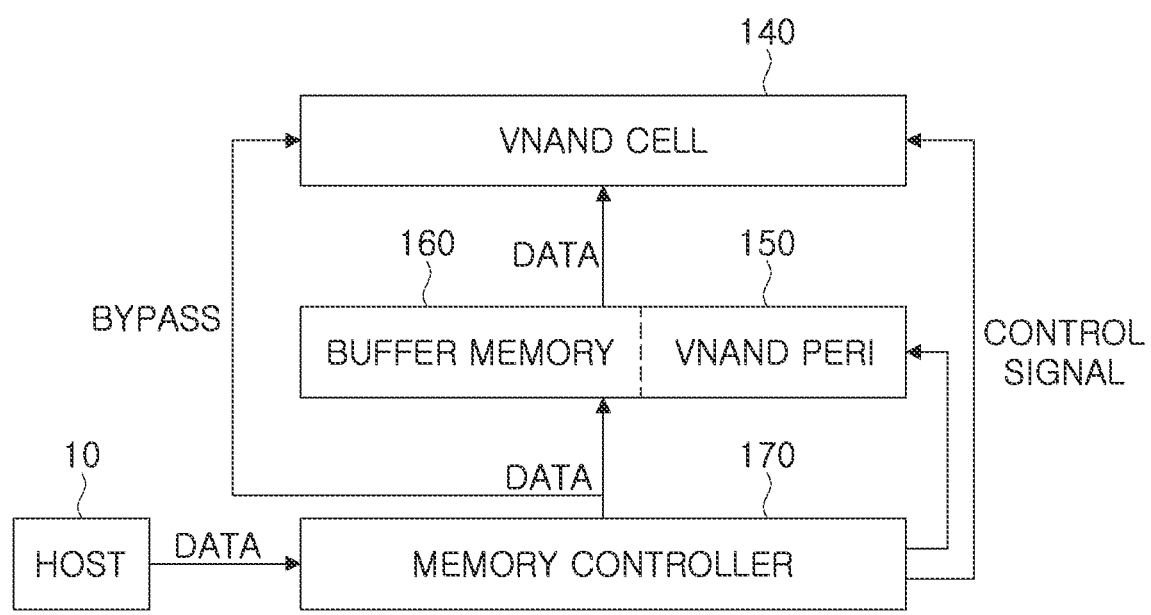
FIG. 13 is a diagram illustrating a read operation of the storage device according to the exemplary embodiment in the present disclosure.
Figure 14:
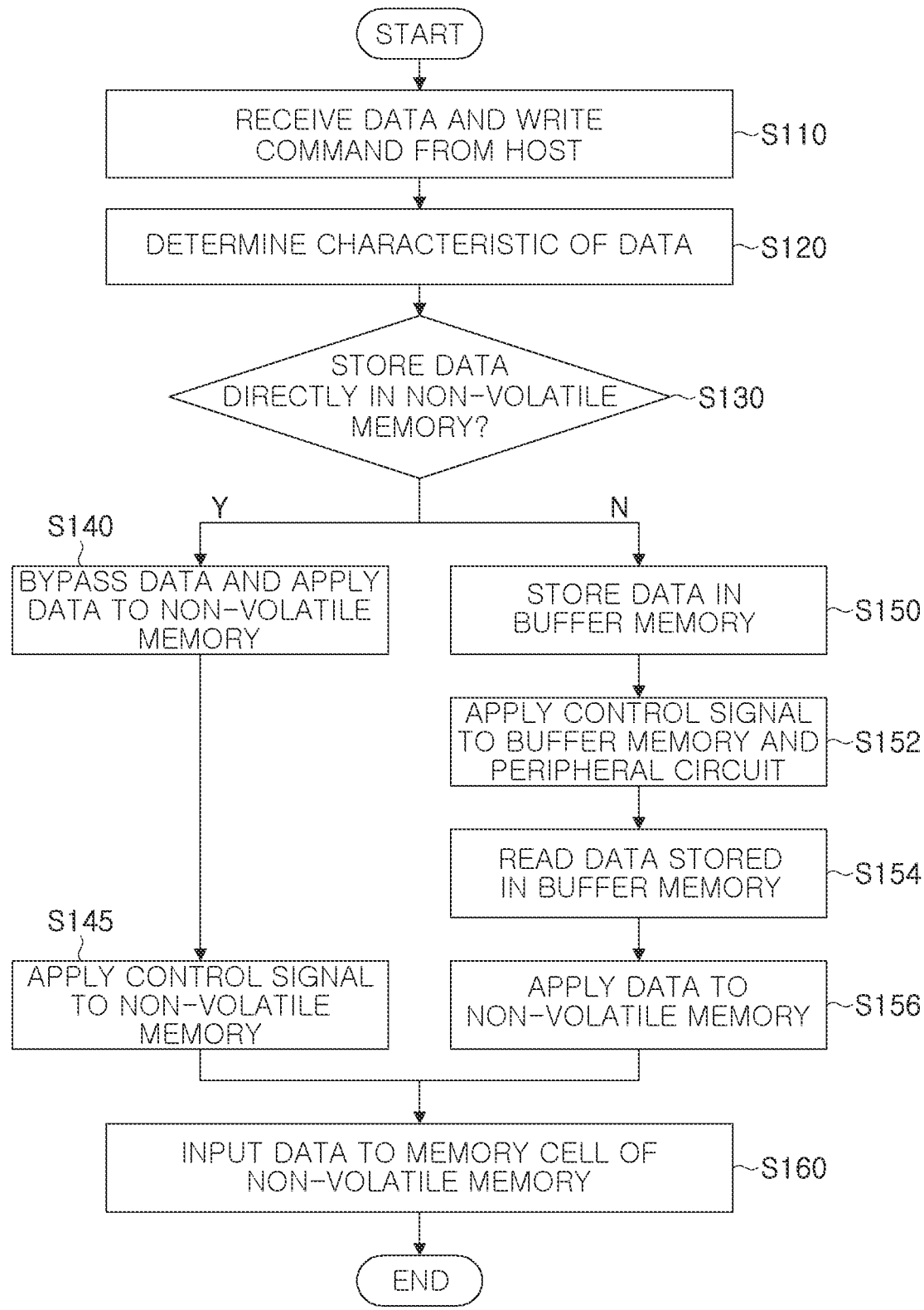
FIG. 14 is a flowchart illustrating the read operation of the storage device according to the exemplary embodiment in the present disclosure.

FIG. 13 is a diagram illustrating a write operation of the storage device according to the exemplary embodiment in the present disclosure. FIG. 14 is a flowchart illustrating the write operation of the storage device according to the exemplary embodiment in the present disclosure.

Referring to FIGS. 13 and 14, the storage device 100 according to the exemplary embodiment in the present disclosure may start a write operation by receiving data and a write command from the host 10 (S110). In this case, the host 10 may transmit the data and write command to the memory controller 170 included in the storage device 100. The storage device 100 may translate the received write command into the form of a control signal.

The memory controller 170 may determine the characteristics of the received data (S120). The memory controller 170 may set a data write path based on the characteristics of the received data. In other words, the memory controller 170 may determine whether to directly store data in the first cell area 140, for example, a VNAND memory cell, based on the characteristics of the received data (S130).

For example, when the received data is sequence data, the memory controller 170 may bypass the buffer memory 160 and directly transmit the data to the first cell area 140 (S140).

The first cell area 140 may receive a command for storing data received from the memory controller 170 (S145). In this case, since the storage device 100 according to the exemplary embodiment in the present disclosure has a stacked single-chip structure, the memory controller 170 may directly apply a control signal to the first cell area 140. The data transmitted from the host 10 may be input to the first cell area 140 based on the applied control signal (S160).

Meanwhile, when the received data is random data, the memory controller 170 may apply a control signal to the buffer memory 160 and the peripheral circuit area 150 (S150) to store the received data in the buffer memory 160 (S152).

Thereafter, the memory controller 170 may read data stored in the buffer memory 160 (S154) and transmit the read data to the first cell area 140 (S156). Accordingly, the data transmitted from the host 10 may be input to the first cell area 140 (S160).

Figure 15:
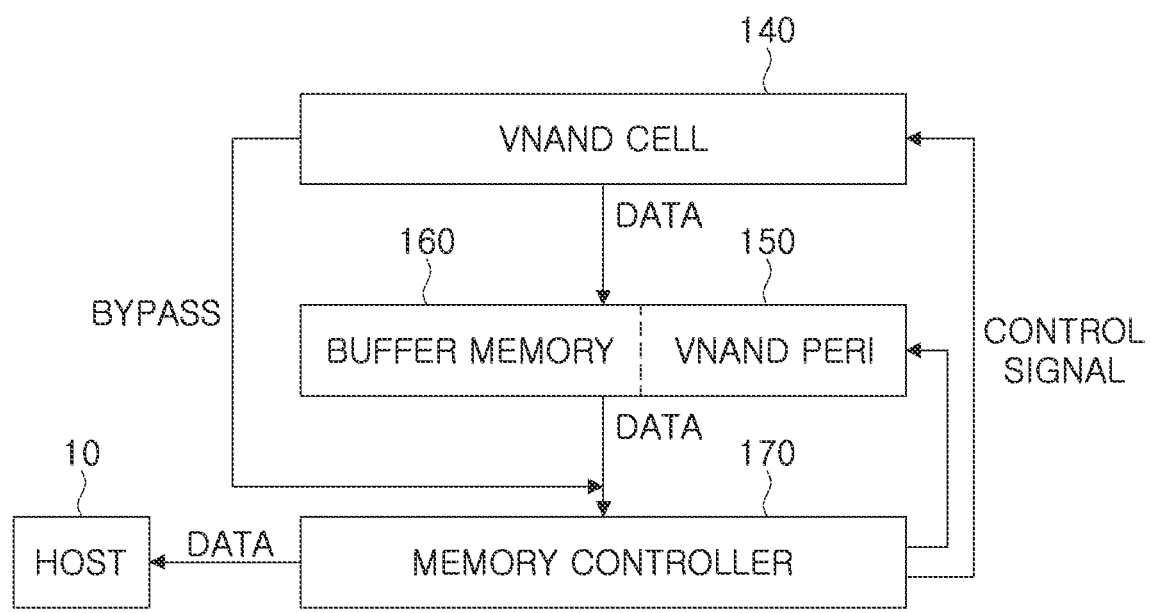
FIG. 15 is a schematic perspective view illustrating the storage device according to the exemplary embodiment in the present disclosure.
Figure 16:
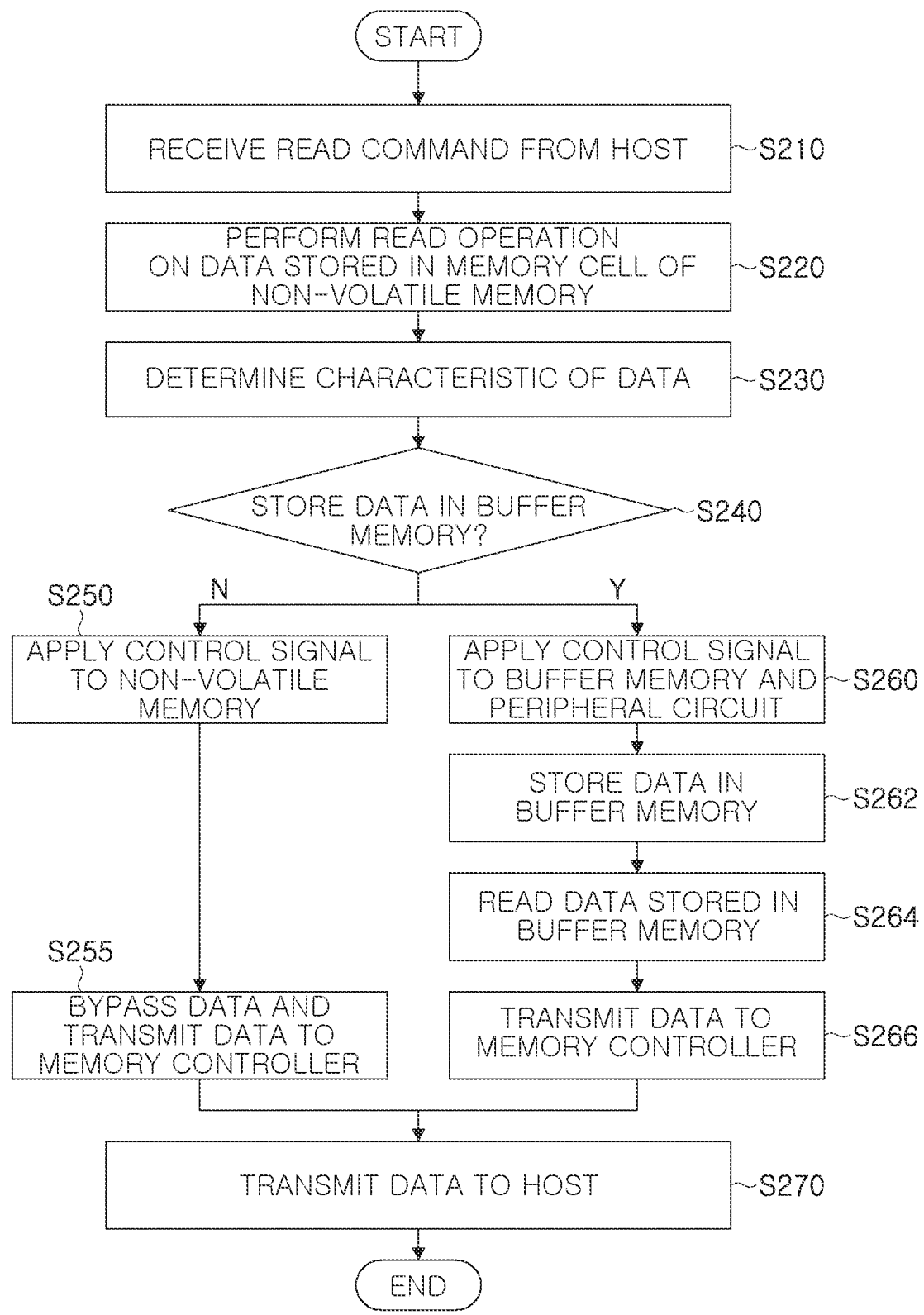
FIG. 16 is a schematic perspective view illustrating a storage device according to another exemplary embodiment in the present disclosure.

FIG. 15 is a diagram illustrating the read operation of the storage device according to the exemplary embodiment in the present disclosure. FIG. 16 is a flowchart illustrating a read operation of the storage device according to the exemplary embodiment in the present disclosure.

Referring to FIGS. 15 and 16, the storage device 100 according to the exemplary embodiment in the present disclosure may start a read operation by receiving a read command from the host 10 (S210). In this case, the host 10 may transmit the read command to the memory controller 170 included in the storage device 100. The storage device 100 may translate the received read command into the form of a control signal.

The memory controller 170 may perform a read operation on data stored in the first cell area 140, for example, a VNAND memory cell, based on the control signal (S220). Similar to the write operation, the memory controller 170 may determine the characteristics of the read data (S230) and determine whether to store the data in the buffer memory 160 based on the characteristics of the read data (S240).

For example, when the received data is sequence data, the memory controller 170 may apply a control signal to the first cell area 140 (S250) and bypasses the buffer memory 160 and directly transmit the read data to the host 10 via the memory controller 170 (S255) (S270).

Meanwhile, when the received data is random data, the memory controller 170 may apply a control signal to the buffer memory 160 and the peripheral circuit area 150 (S260) to store the read data in the buffer memory 160 (S262).

Thereafter, the memory controller 170 may read data stored in the buffer memory 160 (S264) and transmit the data to the host 10 via the memory controller 170 (S266) (S270).

Figure 17:
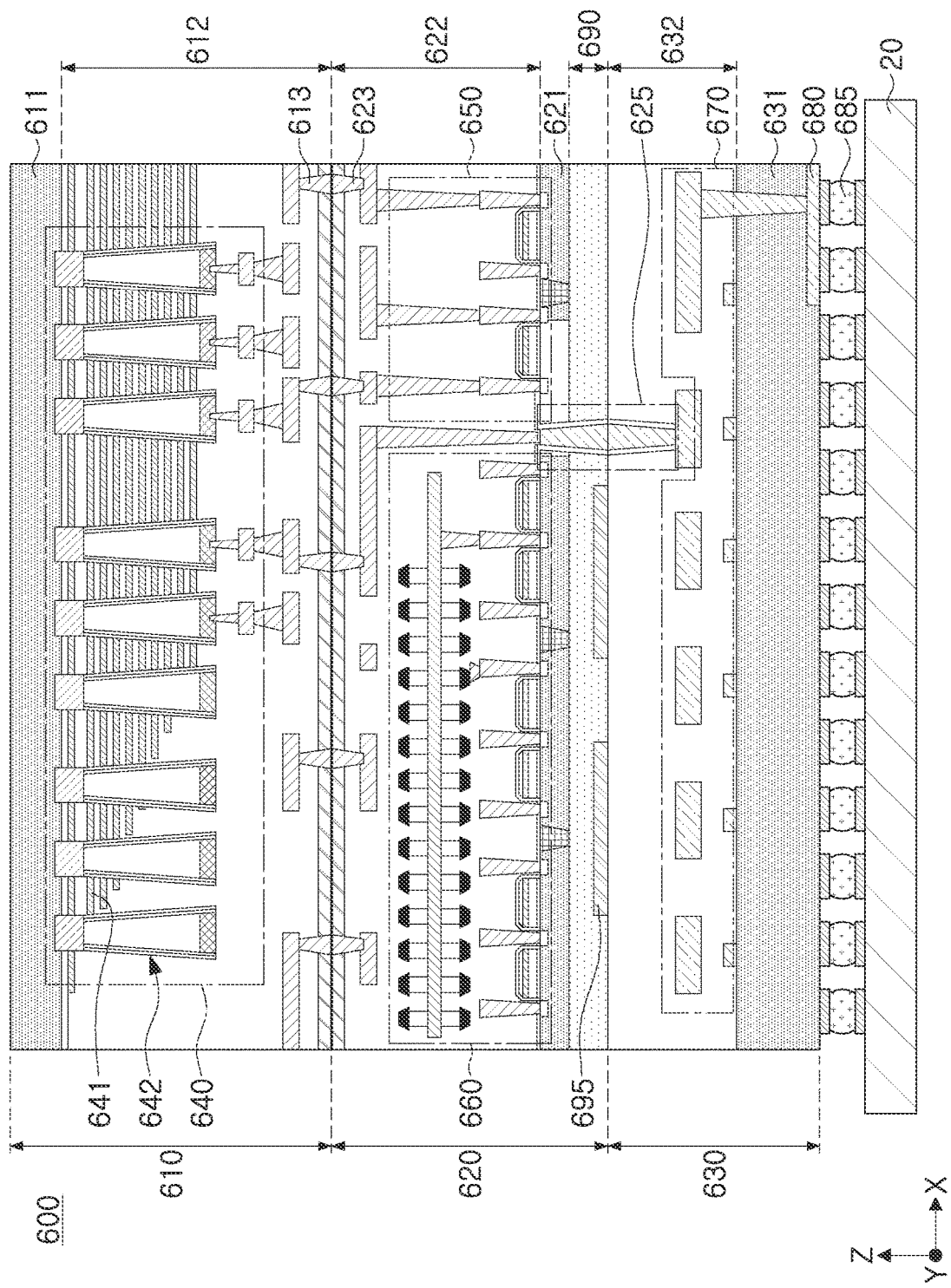
FIG. 17 is a diagram illustrating a form of disposing the storage device according to the exemplary embodiment in the present disclosure on a printed circuit board.

FIG. 17 is a diagram illustrating a form of disposing the storage device, according to the exemplary embodiment in the present disclosure, on a printed circuit board.

Referring to FIG. 17, a storage device 600 according to an exemplary embodiment in the present disclosure may correspond to the storage device 100 illustrated in FIG. 1. However, in the storage device 600 illustrated in FIG. 17, a third metal pad 680 and a printed circuit board 20 may be connected through a bump 685. The storage device 600 may be packaged in the form of a ball grid array (BGA).

The storage device 600 according to the exemplary embodiment in the present disclosure may reduce the overall size of the storage device 600 in the form of a single chip compared to the conventional product by combining the storage device 600 with the printed circuit board 20. In addition, since a separate interface according to the inter-chip connection is not required, the memory controller 670 may directly control the first cell area 640 and the second cell area 660. Accordingly, steps such as command interpretation and data signal translation may be omitted during the operation of the storage device 600, and thus the operating speed may be improved.

Figure 18:
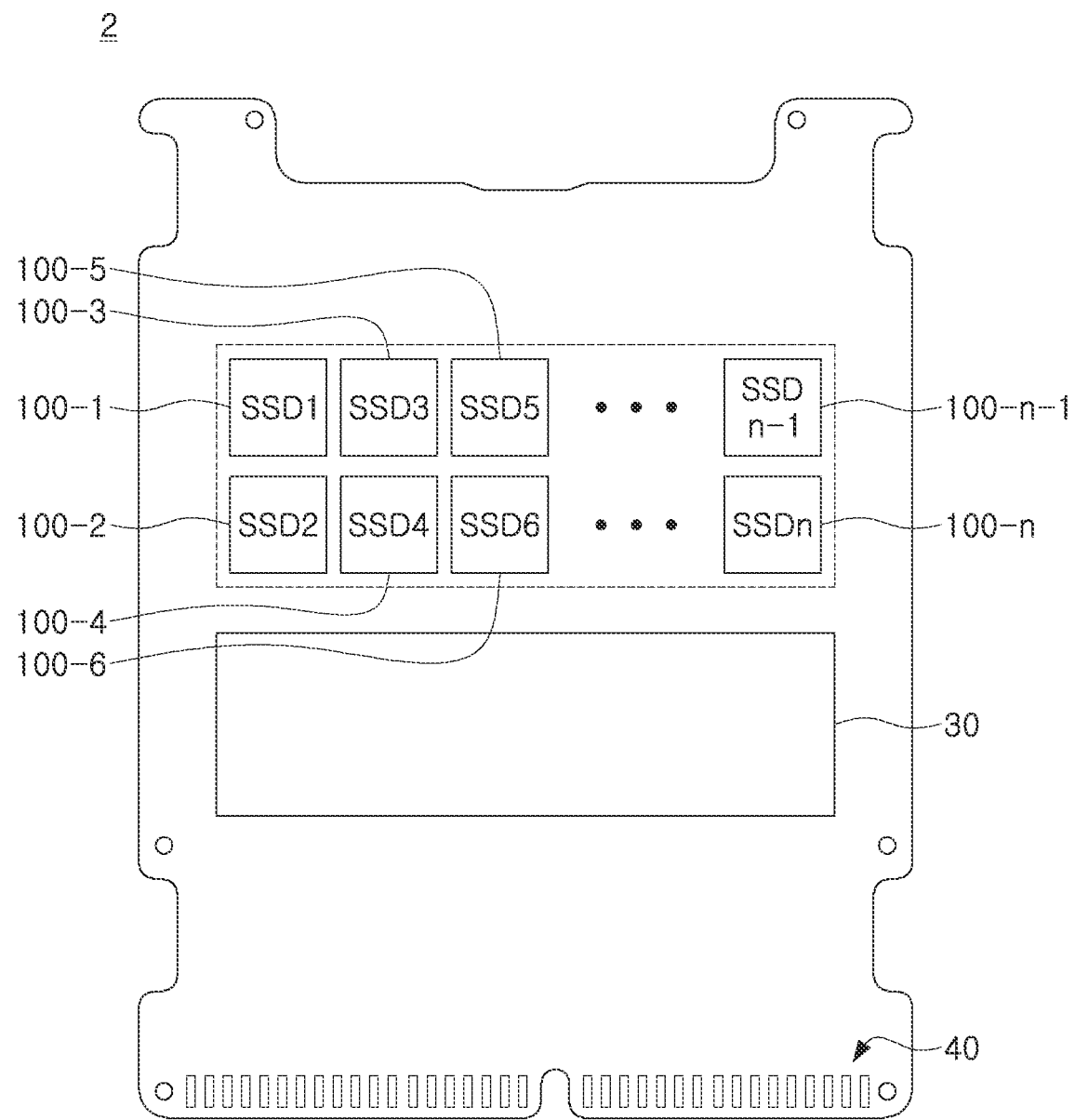
FIG. 18 is a diagram schematically illustrating a storage system according to an exemplary embodiment in the present disclosure.

FIG. 18 is a diagram schematically illustrating a storage system according to an exemplary embodiment in the present disclosure.

Referring to FIG. 18, a storage system 2 according to an exemplary embodiment in the present disclosure may include a plurality of storage devices 100-1, 100-2, . . . , 100-n each of which is formed in a single chip, a network switch 30, and a connector 40. As an example, the storage system 2 may be implemented on one printed circuit board.

Each of the plurality of storage devices 100-1, 100-2, . . . , 100-n may correspond to the storage devices 100, 200, 300, 400, 500, and 600 illustrated in FIGS. 1 to 17. For example, each of the plurality of storage devices 100-1, 100-2, . . . , 100-n may include a first semiconductor structure including a first cell area, a second semiconductor structure including a peripheral circuit area and a second cell area, and a third semiconductor structure including a memory controller. The first semiconductor structure may be bonded to the second semiconductor structure by a wafer bonding method, and the second semiconductor structure and the third semiconductor structure may be electrically connected to each other through the connection structure.

In the storage system 2 according to the exemplary embodiment in the present disclosure, the connector 40 may receive data from the host and transmit the data to the network switch 30. Meanwhile, the network switch 30 may distribute data received through the connector 40 to the plurality of storage devices 100-1, 100-2, . . . , 100-n.

The storage system 2 may be reduced in size by coupling the plurality of storage devices 100-1, 100-2, . . . , 100-n to one printed circuit board and improve the operating speed of the plurality of storage devices 100-1, 100-2, . . . , 100-n. In addition, data may be exchanged between the plurality of storage devices 100-1, 100-2, . . . , 100-n without the involvement of the host and the capacity of the server may be easily increased by further coupling the storage device to the printed circuit board.

FIGS. 19A to 19E are diagrams illustrating a process of manufacturing a storage device according to an exemplary embodiment in the present disclosure.

FIGS. 19A to 19E may be diagrams schematically illustrating a process of manufacturing the storage device 100 illustrated in FIG. 1. The manufacturing process of FIGS. 19A to 19E may be similarly applied to the storage devices 200, 300, 400, 500, and 600 according to other exemplary embodiments. However, this is only an example and may not be limited. For example, the first semiconductor structure 110, the second semiconductor structure 120, and the third semiconductor structure 130 included in the storage device 100 may be independently manufactured regardless of an order.

Figure 19A:
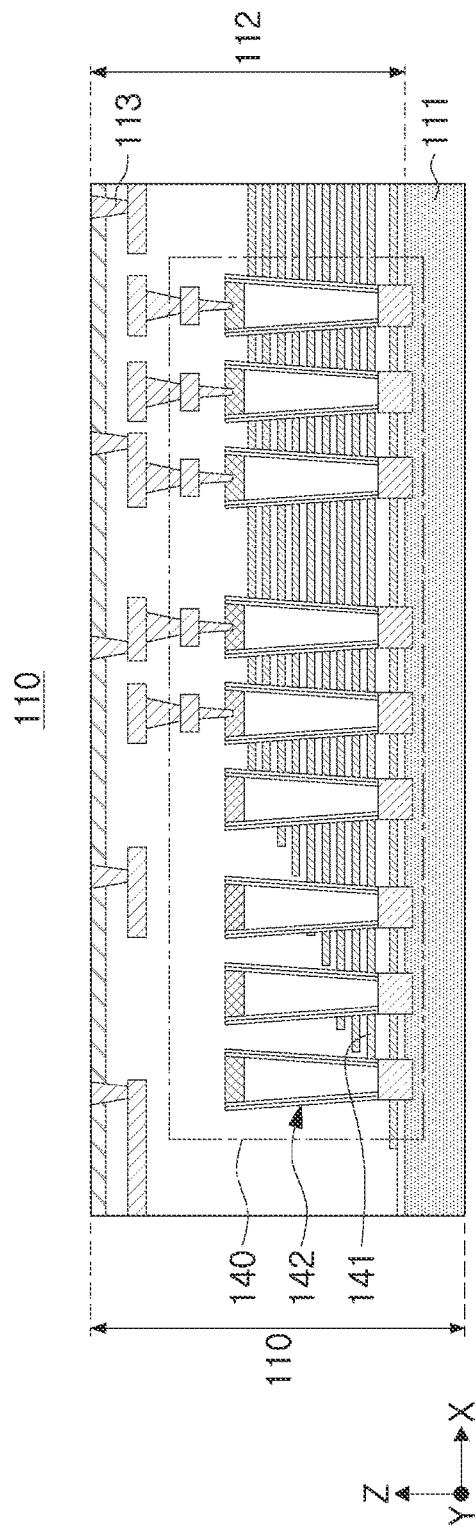
FIGS. 19A to 19E are diagrams illustrating a process of manufacturing a storage device according to an exemplary embodiment in the present disclosure.

Referring to FIG. 19A, in the first semiconductor structure 110, the first cell area 140 including gate electrodes 141 and channel structures 142 may be formed on the first semiconductor substrate 111. In this case, a first metal pad 113 for bonding the first semiconductor structure 110 to other structures may be formed above the memory cell area 140.

Figure 19B:
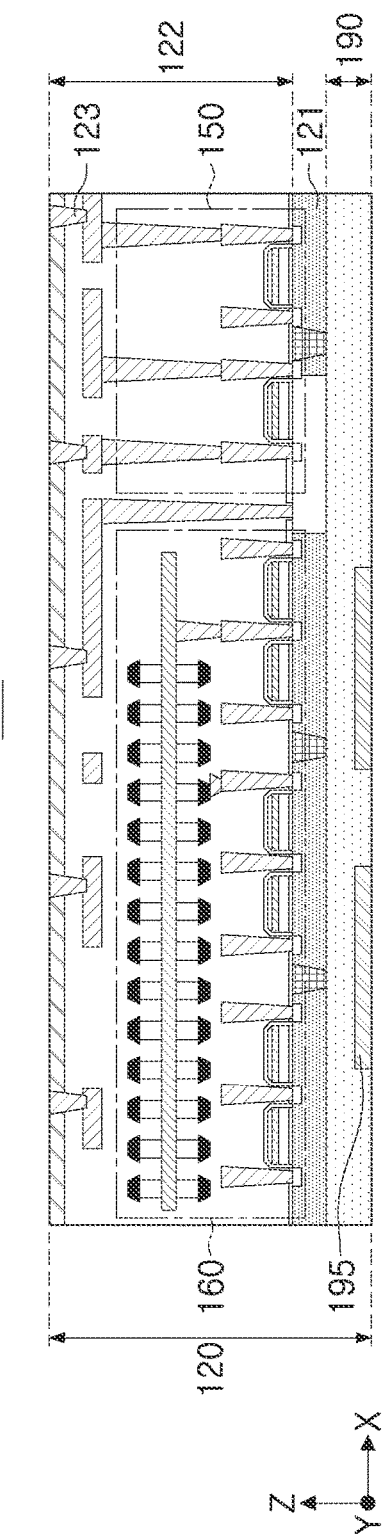

Referring to FIG. 19B, in the second semiconductor structure 120, the peripheral circuit area 150 and the second cell area 160 may be formed on the second semiconductor substrate 121. In this case, a second metal pad 123 for bonding the second semiconductor structure 120 to other structures may be formed above the peripheral circuit area 150 and/or the second cell area 160. For example, the position of the second metal pad 123 may correspond to the position of the first metal pad 113.

Figure 19C:
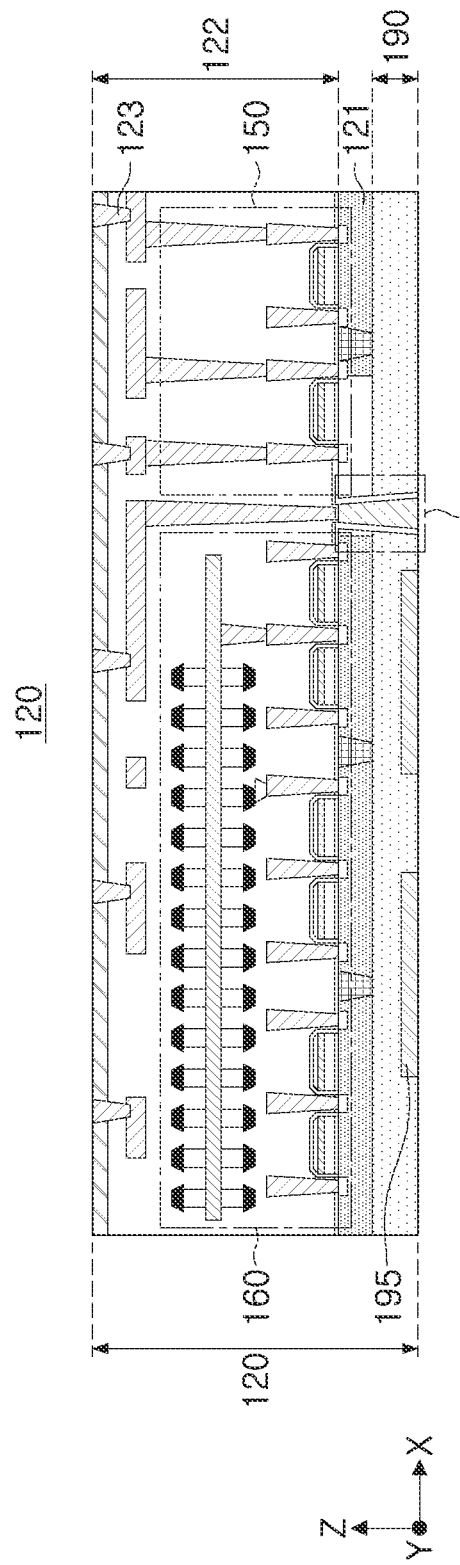

Referring to FIG. 19C, a connection structure 125a penetrating through the second semiconductor substrate 121 may be formed in the second semiconductor structure 120. For example, the connection structure 125a may be electrically connected to the peripheral circuit area 150 and the second cell area 160 of the second semiconductor structure 120.

Figure 19D:
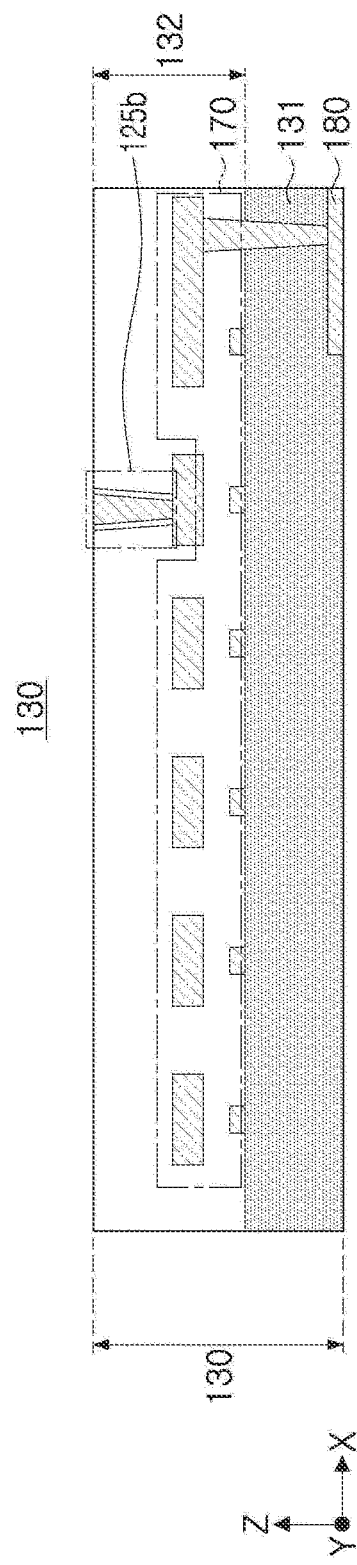

Referring to FIG. 19D, in the third semiconductor structure 130, the memory controller 170 connected to the third metal pad 180 through the connection via penetrating through the third semiconductor substrate 131 may be formed on the third semiconductor substrate 131. In this case, the connection structure 125b for bonding the third semiconductor structure 130 to other structures may be formed above the memory controller 170. For example, the position of the connection structure 125b included in the third semiconductor structure 130 may correspond to the position of the connection structure 125a included in the second semiconductor structure 120.

Figure 19E:
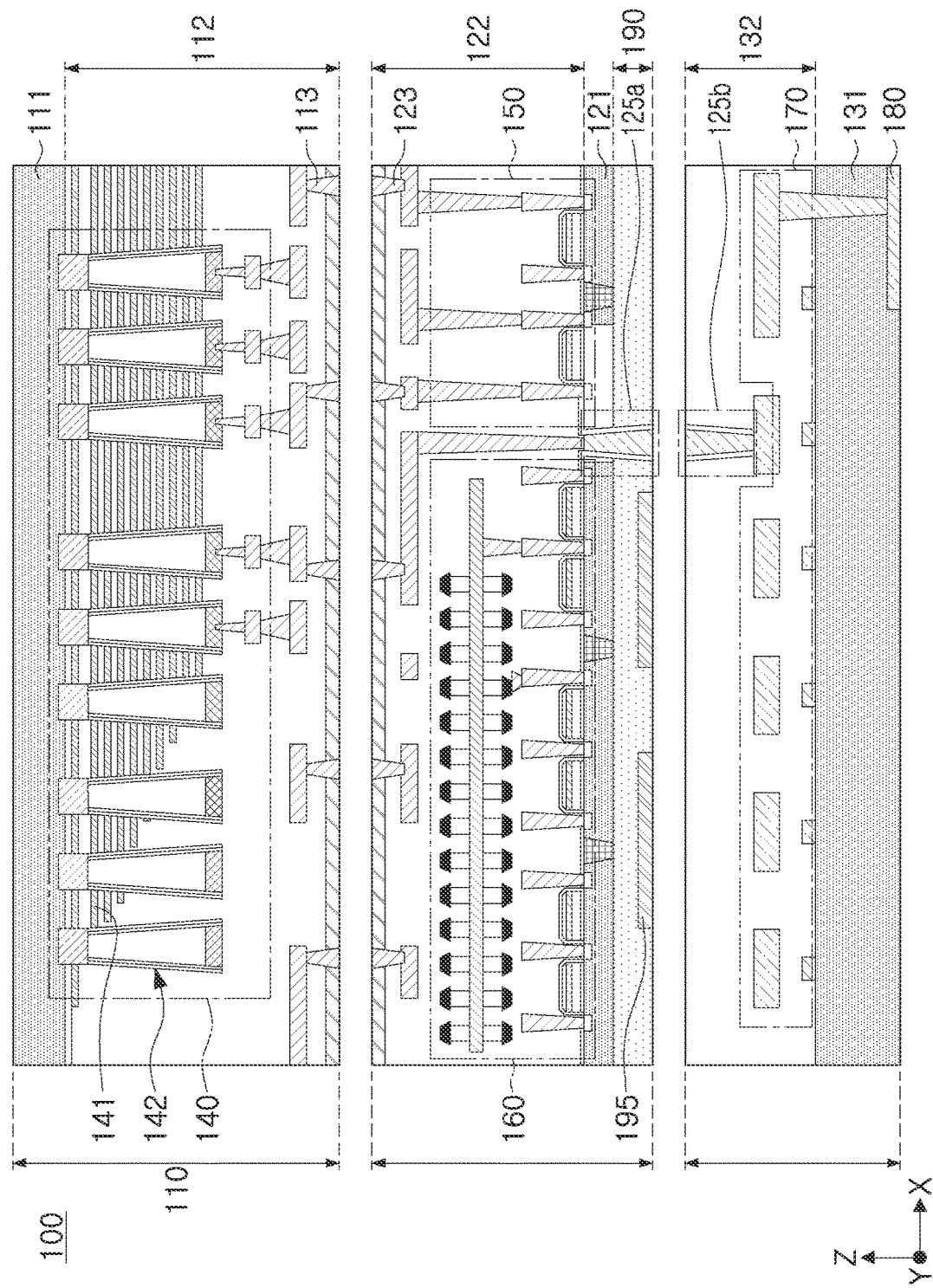

Referring to FIG. 19E, the first semiconductor structure 110, the second semiconductor structure 120, and the third semiconductor structure 130 manufactured through FIGS. 19A to 19D may be bonded to be stacked in the first direction (e.g., Z direction). For example, the first semiconductor structure 110 may be bonded to the second semiconductor structure 120 through the bonding of the first metal pad 113 and the second metal pad 123. Also, the second semiconductor structure 120 may be bonded to the third semiconductor structure 130 through the bonding of the connection structures 125a and 125b.

Since a storage device according to an exemplary embodiment in the present disclosure is manufactured as a single chip, it is possible to reduce a size of the storage device and improve an operating speed of the storage device.

A storage system according to an exemplary embodiment in the present disclosure may dispose a plurality of storage devices each manufactured as a single chip on one printed circuit board.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

Various and beneficial advantages and effects of the present disclosure are not limited to the contents described above and may be more easily understood in a process of describing exemplary embodiments of the present disclosure.

While the present disclosure has been shown and described in connection with the exemplary embodiments, it will be apparent to those in the art that modifications and variations can be made without departing from the spirit and scope of the disclosure as defined by the appended claims. Accordingly, various types of substitutions, modifications and changes will be possible by those of ordinary skill in the art without departing from the present disclosure described in the claims and belong to the scope of the present disclosure.

What is claimed is:

1. A storage device comprising:
a first semiconductor structure including a first cell area, including a plurality of first memory cells disposed on a first semiconductor substrate, and a first metal pad disposed above the first cell area, the first cell area including gate electrodes stacked on the first semiconductor substrate, spaced apart from each other, and channel structures penetrating through the gate electrodes and connected to the first semiconductor substrate;
a second semiconductor structure including a peripheral circuit area disposed on a second semiconductor substrate and on which peripheral circuits for controlling the plurality of first memory cells are disposed, a second cell area including a plurality of second memory cells disposed adjacently to the peripheral circuit area, and a second metal pad bonded to the first metal pad; and
a third semiconductor structure including a memory controller disposed on a third semiconductor substrate and connected to a third metal pad through a connection via penetrating through the third semiconductor substrate and a connection structure penetrating through the second semiconductor substrate and connecting the memory controller to the second semiconductor structure, the memory controller controlling the first cell area and the second cell area based on a signal applied from a host through the third metal pad.

2. The storage device of claim 1, wherein in the second semiconductor structure, the peripheral circuit area is disposed closer to an edge of the second semiconductor substrate than the second cell area.

3. The storage device of claim 1, wherein a contact pad for electrically connecting the second cell area and the peripheral circuit area to an external circuit is further disposed on one side of the first semiconductor substrate.

4. The storage device of claim 1, wherein a contact pad for electrically connecting the second cell area and the peripheral circuit area to an external circuit is further disposed on one side of the second semiconductor substrate.

5. The storage device of claim 1, wherein the third metal pad is connected to a printed circuit board through a bump.

6. The storage device of claim 1, wherein the first cell area and the second cell area are disposed between the first semiconductor substrate and the second semiconductor substrate.

7. A storage device comprising:
a non-volatile memory including a first cell area, including a plurality of first memory cells disposed on a first semiconductor substrate, and a peripheral circuit area disposed on a second semiconductor substrate and including a peripheral circuit for controlling the plurality of first memory cells;
a buffer memory including a second cell area disposed on the second semiconductor substrate, the second cell area including a plurality of second memory cells temporarily storing data to be stored in the plurality of first memory cells and data stored in the plurality of first memory cells; and
a memory controller disposed on a third semiconductor substrate and configured to control an operation on the plurality of second memory cells using a selection circuit disposed on the second semiconductor substrate, wherein:
a first metal pad disposed above the first cell area and a second metal pad disposed above the peripheral circuit are bonded to each other in a direction perpendicular to an upper surface of the first semiconductor substrate, and
a connection structure penetrating through the second semiconductor substrate is electrically connected to the third semiconductor substrate.

8. The storage device of claim 7, wherein the memory controller converts a control command transmitted from a host into a control signal and applies the control signal to the non-volatile memory or the buffer memory.

9. The storage device of claim 7, wherein each of the plurality of first memory cells is a flash NAND memory cell and the plurality of second memory cells constitute one of DRAM, MRAM, PRAM, and SRAM.

10. The storage device of claim 7, wherein the memory controller determines, based on characteristics of data transmitted from a host, whether to process the data for the plurality of first memory cells via the plurality of second memory cells or to process the data for the plurality of first memory cells without passing through the plurality of second memory cells.

11. The storage device of claim 10, wherein when the data transmitted from the host or the data stored in the plurality of first memory cells are sequence data or data requiring long-term storage, the memory controller processes the data for the plurality of first memory cells without passing the data through the plurality of second memory cells.

12. The storage device of claim 10, wherein when the data transmitted from the host or the data stored in the plurality of first memory cells are random data or periodically modified data, the memory controller processes the data for the plurality of first memory cells via the plurality of second memory cells.

13. The storage device of claim 7, wherein the memory controller periodically stores and reads data into the plurality of second memory cells based on a difference between a speed at which data is transmitted and received to and from a host and a speed at which the data is processed in the plurality of first memory cells.

14. The storage device of claim 7, wherein when data is stored in all the plurality of second memory cells, the memory controller stores the data transmitted from a host in the plurality of first memory cells without passing the data through the plurality of second memory cells.

15. The storage device of claim 7, wherein the memory controller further includes a static RAM (SRAM) for specifying locations of data to be stored in the plurality of first memory cells and data stored in the plurality of first memory cells.

16. The storage device of claim 15, wherein a selection circuit for controlling an operation on the static RAM is further disposed on the third semiconductor substrate.

17. A storage system comprising:
a plurality of storage devices each configured in a single chip including:
a first semiconductor structure including a first cell area,
a second semiconductor structure that is bonded to the first semiconductor structure by a wafer bonding method and including a peripheral circuit area and a second cell area, and
a third semiconductor structure on which a memory controller is disposed, the memory controller being connected to the second semiconductor structure through a connection structure penetrating through a semiconductor substrate included in the second semiconductor structure;
a network switch configured to distribute data to the plurality of storage devices; and
a connector configured to receive the data from a host and transmit the data to the network switch.

18. The storage system of claim 17, wherein a metal pad to which the data is input from the host is disposed on one side of the third semiconductor structure.

19. The storage system of claim 18, wherein when the data that is input from the host is written to the first cell area, the memory controller determines whether to allow the data to pass through the second cell area according to a characteristic of the data.

20. The storage system of claim 17, wherein the plurality of storage devices, the network switch, and the connector are disposed on one printed circuit board.

* * * * *